United States Patent
Sasaki et al.

(10) Patent No.: US 6,294,439 B1
(45) Date of Patent: Sep. 25, 2001

(54) METHOD OF DIVIDING A WAFER AND METHOD OF MANUFACTURING A SEMICONDUCTOR DEVICE

(75) Inventors: Shigeo Sasaki, Chigasaki; Shinya Takyu, Saitama-ken; Keisuke Tokubuchi, Yokohama; Koichi Yazima, Chigasaki; Hideo Nakayoshi, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/499,466

(22) Filed: Feb. 7, 2000

Related U.S. Application Data

(63) Continuation-in-part of application No. 09/234,505, filed on Jan. 21, 1999, now Pat. No. 6,184,109, which is a continuation-in-part of application No. 09/065,626, filed on Apr. 24, 1998, now Pat. No. 5,888,883.

(30) Foreign Application Priority Data

Jul. 23, 1997 (JP) .................................. 9-197291

(51) Int. Cl.⁷ ...................... H01L 21/46; H01L 21/78; H01L 21/301
(52) U.S. Cl. ...................... 438/464; 438/33; 438/113; 438/460; 438/462; 438/928; 438/977
(58) Field of Search .................. 438/33, 113, 460, 438/462, 464, 928, 977

(56) References Cited

U.S. PATENT DOCUMENTS

| | | |
|---|---|---|
| 4,722,130 | 2/1988 | Kimura et al. . |
| 4,904,610 | 2/1990 | Shyr . |
| 4,978,639 | 12/1990 | Hua et al. . |
| 5,071,792 | 12/1991 | Van Vonno et al. . |
| 5,091,331 | 2/1992 | Delgado et al. . |
| 5,130,276 | 7/1992 | Adams et al. . |
| 5,185,292 | 2/1993 | Van Vonno et al. . |
| 5,393,707 * | 2/1995 | Canning ................................. 438/33 |
| 5,480,842 | 1/1996 | Clifton et al. . |
| 5,501,104 * | 3/1996 | Ikeda et al. ........................... 73/629 |

FOREIGN PATENT DOCUMENTS

| | | |
|---|---|---|
| 54-14155 | 7/1977 | (JP) . |
| 55-52235 | 10/1978 | (JP) . |

(List continued on next page.)

*Primary Examiner*—Charles Bowers
*Assistant Examiner*—Asok Kumar Saricar
(74) *Attorney, Agent, or Firm*—Finnegan, Henderson, Farabow, Garrett & Dunner, L.L.P.

(57) ABSTRACT

Grooves are formed in a surface of a wafer, on which semiconductor elements are formed, along dicing lines or chip parting lines on the wafer. The grooves are deeper than the thickness of a finished chip, and each of them has a curved bottom surface. A holding sheet is attached on the surface of the wafer on which the semiconductor elements are formed. Subsequently, the rear surface of the wafer is lapped and polished to the thickness of the finished chip, thereby dividing the wafer into chips. Even after the wafer is divided into the chips, the lapping and polishing is continued until the thickness of the wafer becomes equal to the thickness of the finished chip. The lapping and polishing amount required to attain the thickness of the finished chip after the lapped face of the wafer reaches the bottom surface of the groove, and a depth of a region of the curved bottom surface of the groove define a ratio of not less than 0.3.

26 Claims, 18 Drawing Sheets

FOREIGN PATENT DOCUMENTS

| | | |
|---|---|---|
| 355075236-A * | 6/1980 | (JP) . |
| 59-186345 | 4/1983 | (JP) . |
| 61-112345 | 11/1984 | (JP) . |
| 62-4341 | 6/1985 | (JP) . |
| 63-117445 | 11/1986 | (JP) . |
| 63-261851 | 4/1987 | (JP) . |
| 64-38209 | 8/1987 | (JP) . |
| 3-191549 | 12/1989 | (JP) . |
| 4-223356 | 12/1990 | (JP) . |
| 4-297056 | 3/1991 | (JP) . |
| 5-211235 | 3/1991 | (JP) . |
| 4-307756 | 4/1991 | (JP) . |
| 4-367250 | 6/1991 | (JP) . |
| 5-74934 | 9/1991 | (JP) . |
| 5-291397 | 4/1992 | (JP) . |
| 6-132432 | 10/1992 | (JP) . |
| 7-106285 | 10/1993 | (JP) . |
| 9-213662 | 1/1996 | (JP) . |

* cited by examiner

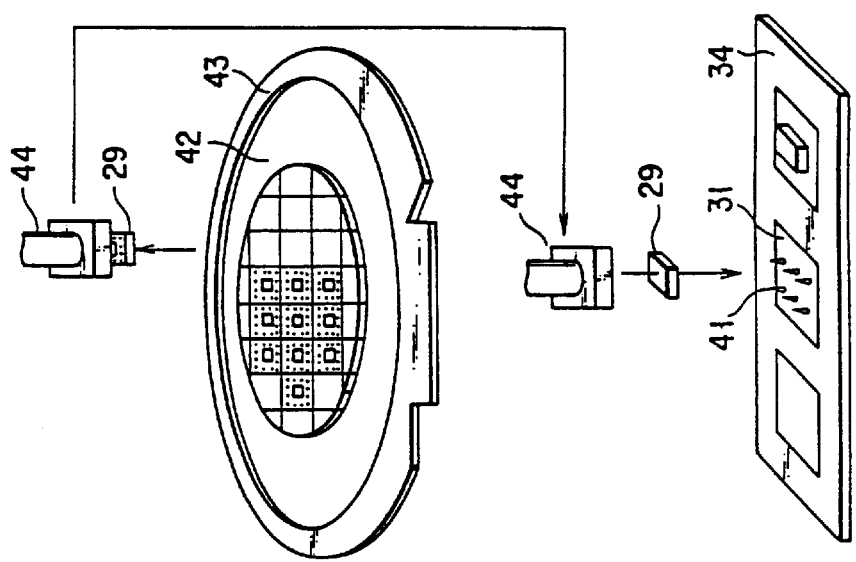
FIG. 23C
FIG. 23B
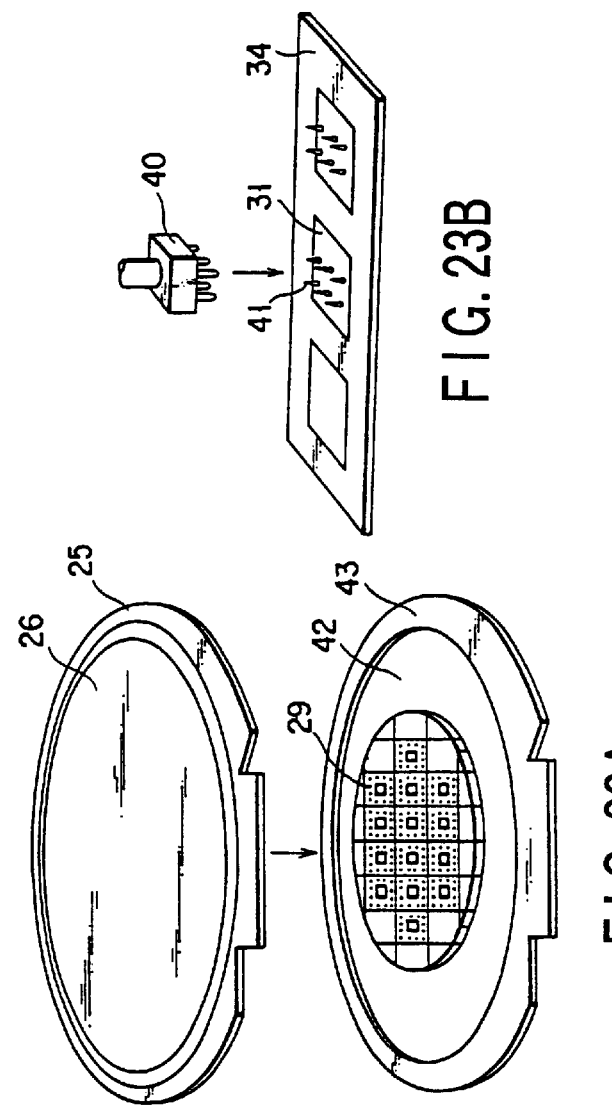
FIG. 23A

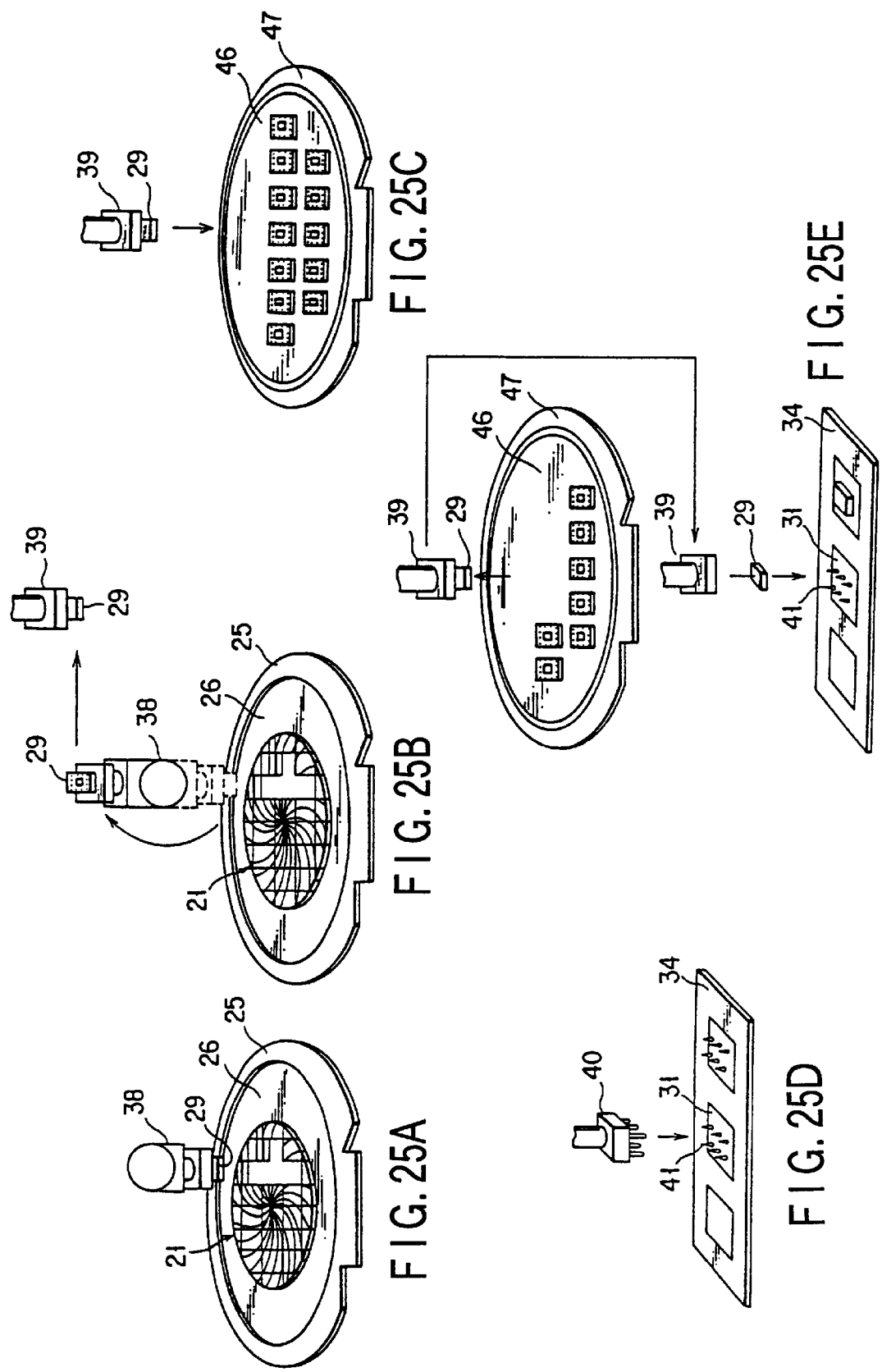

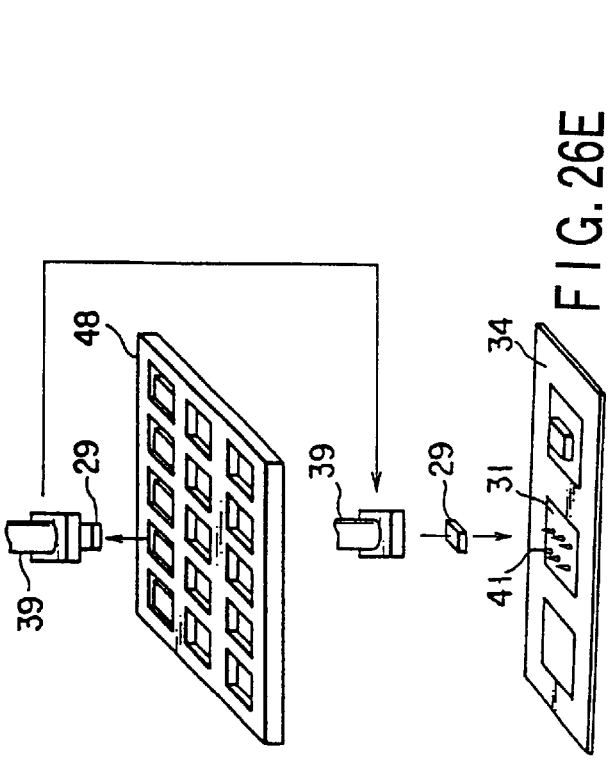
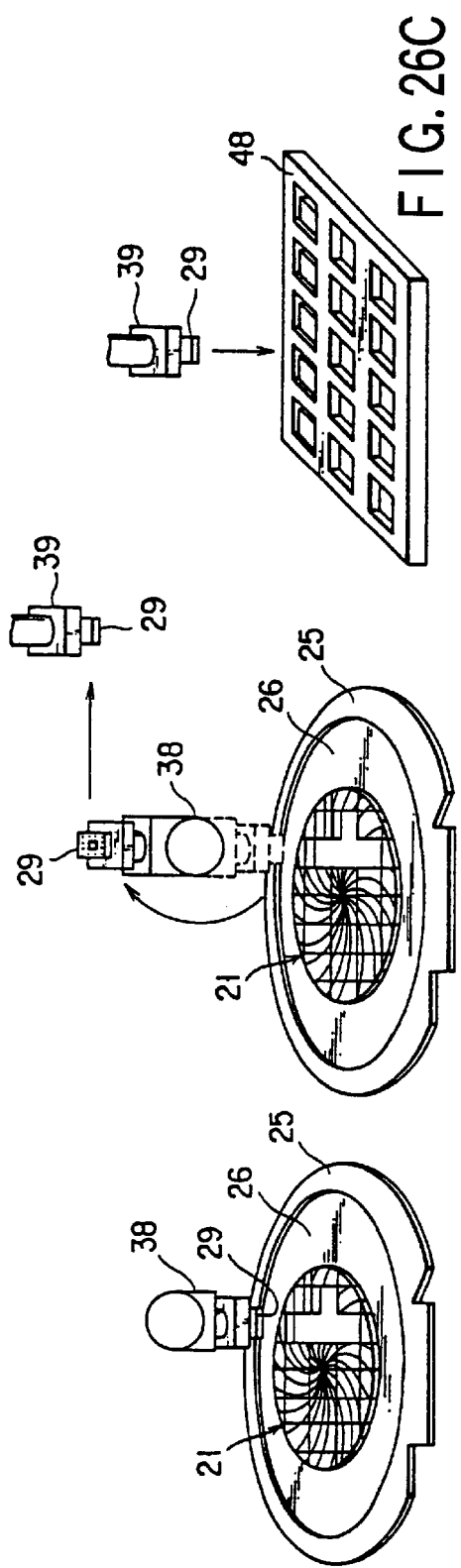
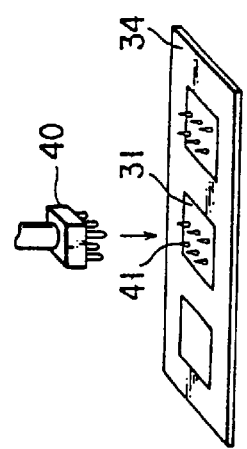

METHOD OF DIVIDING A WAFER AND METHOD OF MANUFACTURING A SEMICONDUCTOR DEVICE

CROSS-REFERENCE TO RELATED APPLICATIONS

This is a Continuation-in-Part of U.S. application Ser. No. 09/234,505, filed Jan. 21, 1999 (U.S. Pat. No. 6,184,109), which in turn is a continuation-in-part of U.S. application Ser. No. 09/065,626 filed Apr. 24, 1998, U.S. Pat. No. 5,888,883).

This application is based upon and claims the benefit of priority from the prior Japanese Patent Application No. 9-197291, filed Jul. 23, 1997; the entire contents of which are incorporated herein by reference.

BACKGROUND OF THE INVENTION

The present invention relates generally to a method of dividing a wafer and a method of manufacturing a semiconductor device, and more particularly to manufacturing steps of dicing semiconductor elements formed in a wafer into chips and sealing the chips in packages, thereby miniaturizing and thinning semiconductor packages and increasing the diameter of the wafer to be used.

The manufacturing steps for semiconductor devices are generally classified into steps for patterning various semiconductor elements in a wafer (semiconductor substrate) and steps for dicing the respective semiconductor elements formed in the wafer into chips and sealing the chips in packages. Recently, the diameter of a wafer has been increased to reduce the manufacturing cost, and there has been a demand for a decrease in size and thickness of packages in order to enhance the packaging density. In the prior art, in order to seal a semiconductor chip in a thinned package, a rear surface of a wafer, which is opposite to a pattern formation surface (major surface) of the wafer, is lapped by a grindstone and polished by free grind grains to thin the wafer prior to dicing the wafer into chips. Then, the wafer is diced. At the time of lapping, an adhesive sheet: or a resist is coated to the pattern formation surface of the wafer in order to protect the pattern formation surface. Thereafter, grooves are formed in dicing line areas provided on the major surface of the wafer. These grooves are formed by means of a diamond scriber, a diamond blade, a laser scriber, etc. The dicing step is carried out by a half-cut method in which the wafer, as a single body, is diced to ½ of the thickness of the wafer or diced until the remaining wafer becomes about 30 $\mu$m thick; a half-cut method in which the wafer is diced similarly, with an adhesive sheet attached to the rear surface of the wafer; or a full-cut method in which the wafer is diced throughout the thickness thereof while the adhesive sheet is cut to a depth of 20 to 30 $\mu$m. The half-cut method requires another dividing step. When the wafer, as a single body, is used, the wafer is sandwiched between soft films, and an external force is applied by a roller or the like, thus dividing the wafer. When the wafer is attached to the adhesive sheet, an external force is applied on the sheet, thus dividing the wafer. The divided chips are separated from the sheet in the following manner. The rear surface of the sheet is pushed up by a pickup needle provided on a die bonding device. The needle penetrates the sheet and comes in direct contact with the rear surface of each chip. The needle is further raised and the chip is separated from the sheet. The surface of the separated chip is held by a tool called "collet" and the chip is mounted on an island of a lead frame. Then, the pads of the chip are electrically connected to inner lead portions of the lead frame by means of wire bonding, and the chip is sealed in a package. The chip may be mounted on the island, for example, by a method in which a conductive paste is coated on the island in advance, a method in which a gold-silicon eutectic is used, or a method in which a thin film is deposited on the rear surface of the wafer and the chip is mounted by using solder.

FIGS. 1 to 7 illustrate in detail an example of the above-described conventional wafer dividing method and semiconductor device manufacturing method. FIG. 1 illustrates a step of attaching a surface protection tape on a wafer; FIG. 2 a step of lapping and polishing the rear surface of the wafer; FIG. 3 a step of separating the surface protection tape; FIGS. 4A and 4B steps of fixing the wafer on a fixing sheet; FIG. 5 a step of dicing the wafer; FIG. 6 a step of picking up separated chips; and FIG. 7 a die bonding step.

As is shown in FIG. 1, the rear surface of a wafer 1 is fixed on a chuck table 2. By rotating and moving an attachment roller 4 in the direction indicated by the arrow, a protection tape 3 is attached on a pattern formation surface (major surface of wafer 1) 1' of the wafer 1. Various semiconductor elements are formed in the pattern formation surface 1' of wafer 1. Subsequently, as shown in FIG. 2, the pattern formation surface 1', on which the protection tape 3 is attached, is situated downward and fixed on a chuck table 5. The rear surface of the wafer 1 is lapped and polished to a predetermined thickness (i.e. a thickness of a finished chip) by means of a grindstone 6. As is shown in FIG. 3, a tape 7 for separating the protection tape 3 is attached to the protection tape 3, and the protection tape 3 is separated from the pattern formation surface 1'. A flat ring 8 is fixed on a wafer fixing sheet 9, as shown in FIG. 4A. With the slack or wrinkles of the sheet 9 removed, the wafer 1 is fixed on the sheet 9 within the opening of the flat ring 8, as shown in FIG. 4B. The sheet 9 on which the wafer 1 is fixed and the flat ring 8 are fixed on a dicing chuck table 10. The wafer 1 is diced (full-cut) by a dicing blade 11 into individual chips 12 (see FIG. 5). As is shown in FIG. 6, a pickup needle 13 is penetrated through the sheet 9 from the bottom thereof and put in contact with the rear surface of each chip 12. The chip 12 is pushed by the needle 13 and separated from the sheet 9. The separated chip 12 is mounted on an island 14 of a lead frame, as shown in FIG. 7, by using a die bonding adhesive such as a conductive paste. Thereafter, although not shown, inner lead portions of the lead frame are wire-bonded to pads of the chip 12, and the resultant structure is sealed in a package formed of a resin or ceramic. Thus, the manufacture of a semiconductor device is completed.

The above-described wafer dividing method and semiconductor device manufacturing method, however, have the following problems (a) to (c).

(a) The wafer tends to be broken while it is thinned by lapping. Even if the wafer is lapped with the protection tape being attached, the wafer may warp due to distortion in the lapping. As a result, the wafer may be caught during transfer within the lapping apparatus and may be broken. Since the strength of the wafer decreases as the thickness of the wafer decreases or the diameter thereof increases. If the wafer body, after it is thinned, is transferred for various processes as in the prior art, the possibility of breakage increases. For example, when the wafer is 400 $\mu$m thick, it can withstand a load of about 1.6 Kgf/mm$^2$. However, if the thickness is decreased to 200 $\mu$m, the breaking strength of the wafer decreases to ¼ or 0.4 Kgf/mm$^2$.

(b) Since the two sheets, one for protecting the pattern formation surface and the other for fixing the wafer at the time of dicing, are used, the attaching and separating steps for the two sheets are required. Consequently, the cost for material increases and the number of manufacturing steps also increases.

(c) The degree of chipping on the rear side of the wafer increases when the wafer is diced, resulting in a decrease in the breaking strength of the chip. Conventionally, transistors, resistors and capacitors for monitoring various characteristics (hereinafter referred to as "TEG" (Test Element Group)) are arranged within the chip. Recently, however, the TEG is arranged on dicing lines for the purpose of a higher integration density. As is well known, the devices of the TEG are formed of oxide films, aluminum, etc. When the devices of TEG are diced by using a diamond blade, the binding of the grindstone of the blade tends to easily occur and the cutting performance deteriorates. Thus, when the TEG is arranged on the dicing lines, the degree of chipping on the rear side of the wafer further increases. In general, the semiconductor substrate is formed of a fragile material such as silicon or GaAs. If a crack occurs, the breaking strength of the wafer decreases.

As has been described above, the conventional wafer dividing method and semiconductor device manufacturing method have the problem in that the wafer tends to be broken while it is being thinned by lapping or transferred. In addition, since the two sheets for protecting the pattern formation pattern and holding the wafer are required, the cost for material increases and the number of manufacturing steps increases. Moreover, the degree of chipping on the rear side of the wafer increases when the wafer is diced, and the breaking strength of the chip decreases.

BRIEF SUMMARY OF THE INVENTION

An object of the present invention is to provide a wafer dividing method and a semiconductor device manufacturing method capable of suppressing breakage of wafers at the time of thinning wafers by lapping or transferring the wafers.

Another object of the invention is to provide a wafer dividing method arid a semiconductor device manufacturing method capable of reducing the number of manufacturing steps and the manufacturing cost.

Still another object of the invention is to provide a wafer dividing method arid a semiconductor device manufacturing method capable of decreasing the degree of chipping on the rear side of wafers and preventing a decrease in breaking strength of chips.

The above objects can be achieved by a wafer dividing method comprising the steps of: forming grooves in a surface of a wafer, on which semiconductor elements are formed, along dicing lines by means of a dicing blade having a curved surface at the tip, the grooves being deeper than a thickness of a finished chip and having a curved bottom surface; attaching a holding member on the surface of the wafer on which the semiconductor elements are formed; and lapping and polishing a rear surface of the wafer to divide the wafer into chips, and keeping on lapping and polishing the rear surface of the wafer even after the wafer is divided into chips, until the wafer is made to have the thickness of the finished chip, wherein a lapping and polishing amount required to attain the thickness of the finished chip after a lapped face of the wafer reaches the bottom surface of the groove, and a depth of a region of the curved bottom surface defines a ratio of not less than 0.3.

The above objects can also be achieved by a wafer dividing method comprising the steps of: forming grooves in a surface of a wafer, on which semiconductor elements are formed, along chip parting lines by etching, a depth of the grooves, as viewed from the major surface of the wafer, being greater than a thickness of a finished chip, and each of the grooves having a curved bottom surface; attaching a holding member on the surface of the wafer on which the semiconductor elements are formed; and lapping and polishing a rear surface of the wafer to divide the wafer into chips, and keeping on lapping and polishing the rear surface of the wafer even after the wafer is divided into chips, until the wafer is made to have the thickness of the finished chip, wherein a lapping and polishing amount required to attain the thickness of the finished chip after a lapped face of the wafer reaches the bottom surface of the groove, and a depth (B) of a region of the curved bottom surface defines a ratio of not less than 0.3.

According to this wafer divining method, grooves, which are deeper than a thickness of a finished chip, are formed in a surface of a wafer on which semiconductor elements are formed, by means of a dicing blade or by utilization of etching, and a rear surface of the wafer is lapped and polished to the thickness of the finished chip, thereby dividing the wafer into chips. Thus, chipping is prevented in the dicing step. In addition, since the bottom surface of each groove is curved, the arch shape of the groove bottom provides the wafer with a remarkable strength when the wafer is lapped and polished. In addition,, silicon chipping is prevented immediately before the wafer is divided into chips, damage to the end faces of the chips is prevented, and the chips are thereby improved in quality. It should be also noted that the lapping and polishing amount required to attain the thickness of the finished chip after a lapped face of the wafer reaches the bottom surface of the groove, and a depth of a region of the curved bottom surface of the groove (22) defines a ratio of not less than 0.3. Owing to this, the average diameter of the particles of the chipping produced in the lapping and polishing step is as small as possible, thus further improving the chip quality.

Further, the above objects can be achieved by a method of manufacturing a semiconductor device, comprising the steps of: forming semiconductor elements in a major surface of a wafer; forming grooves in the major surface of the wafer along dicing lines on the wafer by means of a dicing blade having a curved surface at the tip, a depth of the grooves, as viewed from the major surface of the wafer, being greater than a thickness of a finished chip, and each of the grooves having a curved bottom surface; attaching an adhesive sheet on the major surface of the wafer; lapping and polishing a rear surface of the wafer to divide the wafer into chips, and keeping on lapping and polishing the rear surface of the wafer even after the wafer is divided into chips, until the wafer is made to have the thickness of the finished chip; and separating each of the divided chips from the adhesive sheet and sealing each chip in a package, wherein a lapping and polishing amount required to attain the thickness of the finished chip after a lapped face of the wafer reaches the bottom surface of the groove, and a depth (B) of a region of the curved bottom surface defines a ratio of not less than 0.3.

The above objects can also be achieved by a method of manufacturing a semiconductor device, comprising the steps of: forming semiconductor elements in a major surface of a wafer; forming grooves in the major surface of the wafer by performing etching along chip parting lines on the wafer, the depth of the grooves, as viewed from the major surface of the wafer, being greater than a thickness of a finished chip, and each of the grooves having a curved bottom surface; attaching an adhesive sheet on the major surface of the wafer; lapping and polishing a rear surface of the wafer to divide the wafer into chips, and keeping on lapping and polishing the rear surface of the wafer even after the wafer is divided into chips, until the wafer is made to have the thickness of the finished chip; and separating each of the divided chips from the adhesive sheet and sealing each chip in a package, wherein a lapping and polishing amount required to attain the thickness of the finished chip after a lapped face of the wafer reaches the bottom surface of the groove, and a depth of a region of the curved bottom surface of the groove (22) defines a ratio of not less than 0.3.

According to this semiconductor device manufacturing method, the step of separating the semiconductor elements formed in the wafer into chips and sealing each chip in the package is carried out in the order of dicing (half-cut), lapping and polishing of the rear surface of the wafer, and die bonding. Specifically, the wafer is divided into chips by the lapping and polishing. Thus, in the state in which the rear surface of the wafer is lapped and polished and the wafer is thinned, the wafer is not transferred or processed. Therefore, breakage of the wafer can be prevented.

Since the number of sheets to be used is only one, the cost for material and the number of manufacturing steps can be reduced, and the manufacturing cost can be decreased. Since there is no need to divide the wafer by applying an external force thereto, chipping can be suppressed.

Since the rear surface of the wafer is lapped and polished and the wafer is thus divided into chips, chipping on the rear side of the wafer can be prevented, and a decrease in breaking strength can be suppressed. In addition, since the bottom surface of each groove is curved, the arch shape of the groove bottom provides the wafer with a remarkable strength when the rear side of the wafer is lapped and polished. In addition, silicon chipping is prevented immediately before the wafer is divided into chips, damage to the end faces of the chips is prevented, and the chips are thereby improved in quality. It should be also noted that the lapping and polishing amount required to attain the thickness of the finished chip after a lapped face of the wafer reaches the bottom surface of the groove, and a depth of a region of the curved bottom surface defines a ratio of not less than 0.3. Owing to this, the average diameter of the particles of the chipping produced in the lapping and polishing step is as small as possible, thus further improving the chip quality.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 23A to 23C illustrate a method of manufacturing a semiconductor device according to a fourth embodiment of the present invention and are, specifically, perspective views illustrating in succession steps of mounting divided chips on lead frames;

FIGS. 25A to 25E illustrate a method of manufacturing a semiconductor device according to a sixth embodiment of the present invention and are, specifically, perspective views illustrating in succession steps of mounting divided chips on lead frames;

FIGS. 26A to 26E illustrate a method of manufacturing a semiconductor device according to a seventh embodiment of the present invention and are, specifically, perspective views illustrating in succession steps of mounting divided chips on lead frames;

DETAILED DESCRIPTION OF THE INVENTION

First Embodiment

Figure 8:
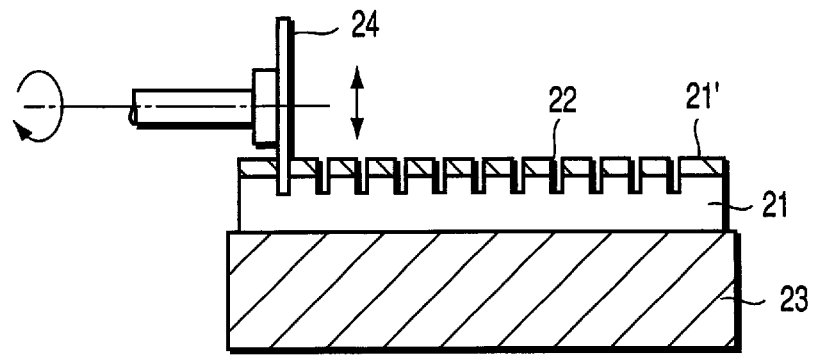
FIG. 8 illustrates a method of manufacturing a semiconductor device according to a first embodiment of the present invention and is, specifically, a cross-sectional side view illustrating a step of forming grooves in a wafer along dicing lines.
Figure 9:
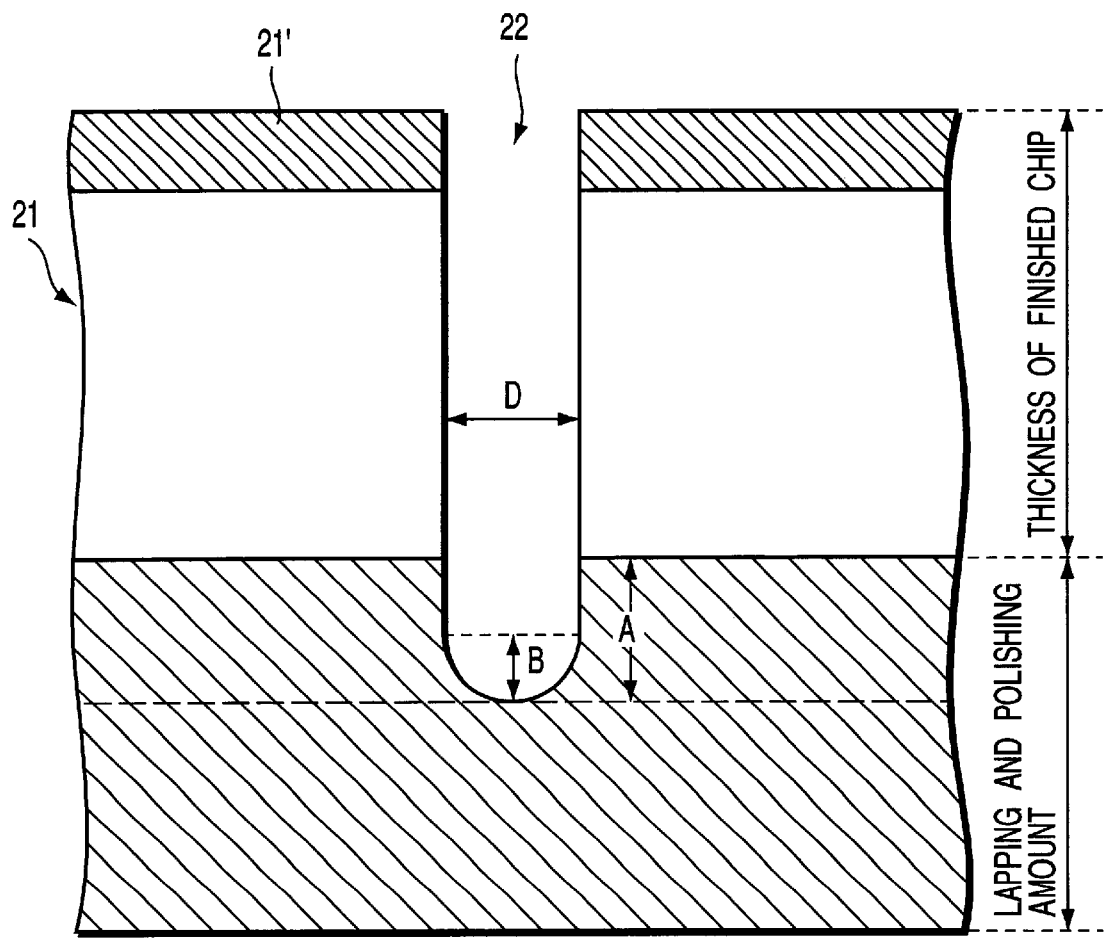
FIG. 9 is an enlarged sectional view of a groove shown in FIG. 8.
Figure 10A:
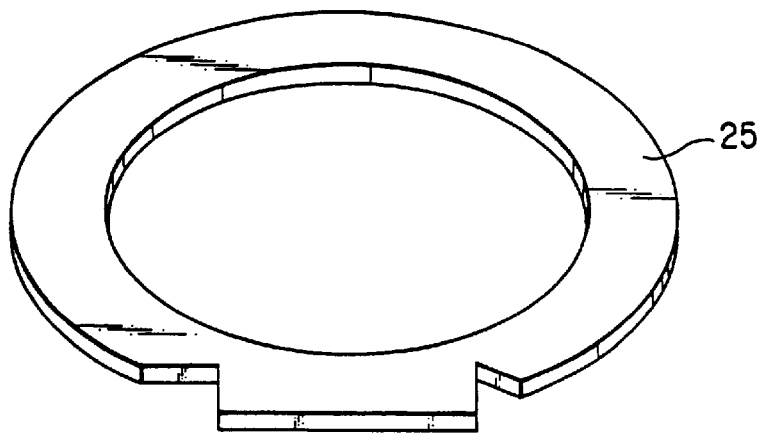
FIG. 10A illustrates the method of manufacturing the semiconductor device according to the first embodiment and is, specifically, a perspective view of a flat ring.
Figure 10B:
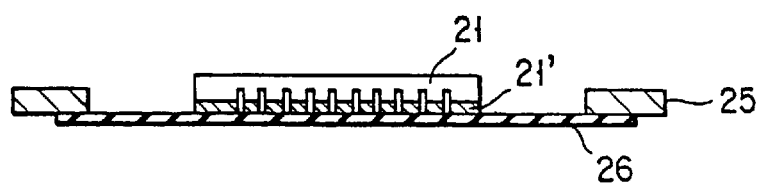
FIG. 10B illustrates the method of manufacturing the semiconductor device according to the first embodiment and is, specifically, a cross-sectional view illustrating a step of attaching a surface protection tape to the wafer.
Figure 11:
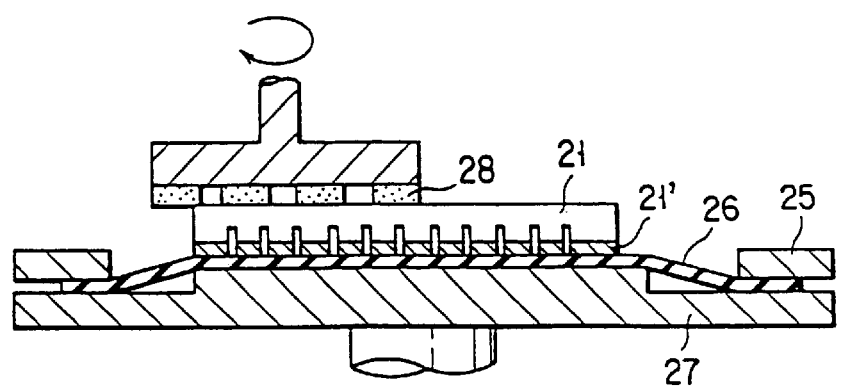
FIG. 11 illustrates the method of manufacturing the semiconductor device according to the first embodiment and is, specifically, a cross-sectional side view illustrating a step of lapping and polishing the rear surface of the wafer (a dividing step)
Figure 12:
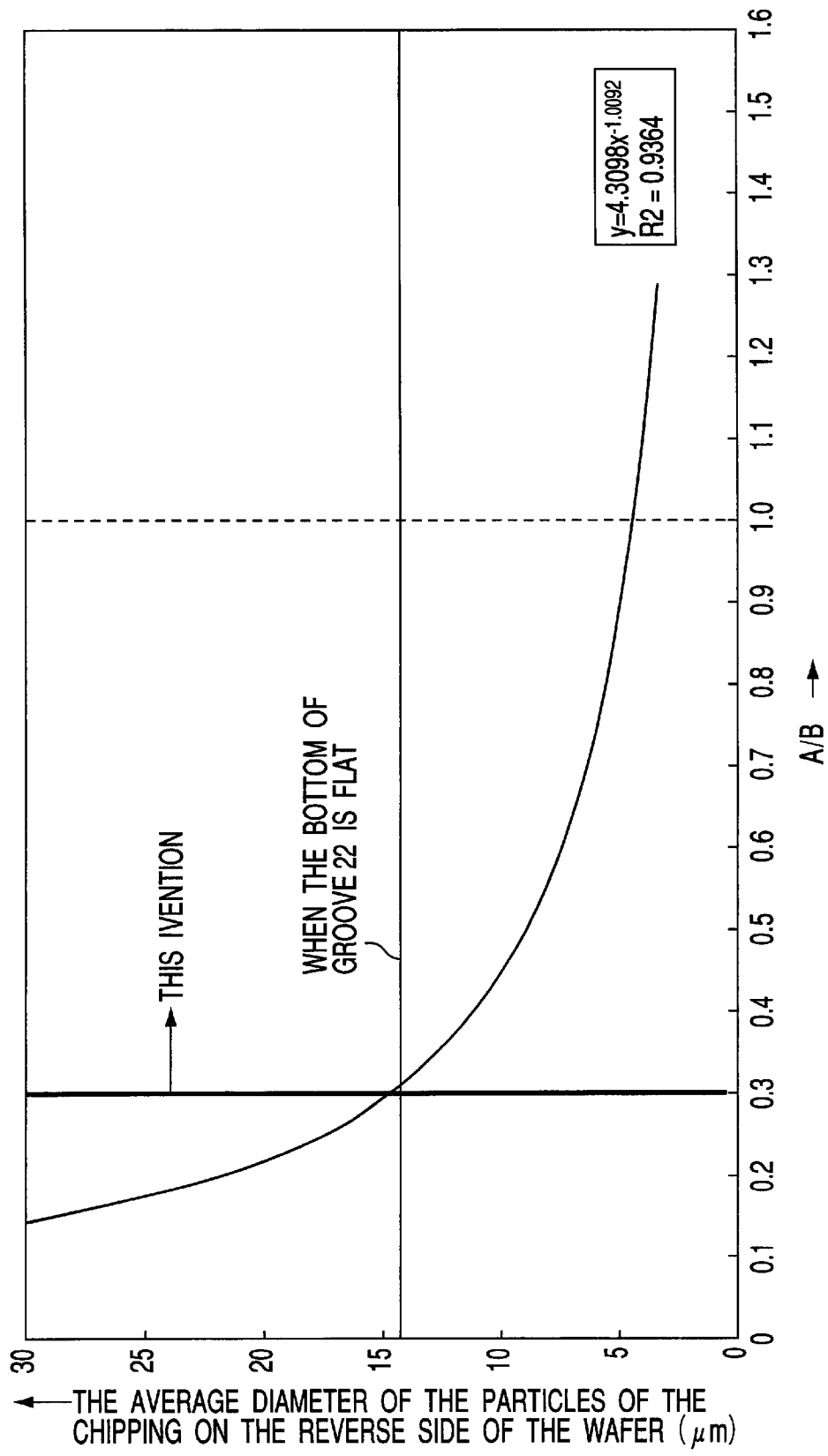
FIG. 12 is a diagram showing how the measurements of the average diameter of the particles of the chipping on the reverse side of the wafer vary when the ratio of the lapping and polishing amount, required to attain the finished chip thickness after the abrasion face reaches the bottom of the groove in the process of removing the rear side of the wafer, to the depth of the curved bottom surface of the groove is changed.
Figure 13:
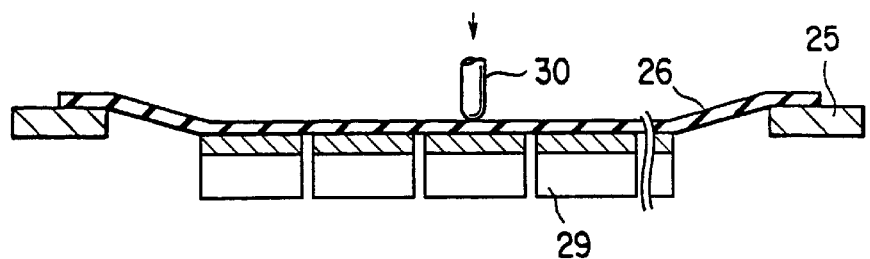
FIG. 13 illustrates the method of manufacturing the semiconductor device according to the first embodiment and is, specifically, a cross-sectional side view illustrating a step of picking up separated chips.
Figure 14:
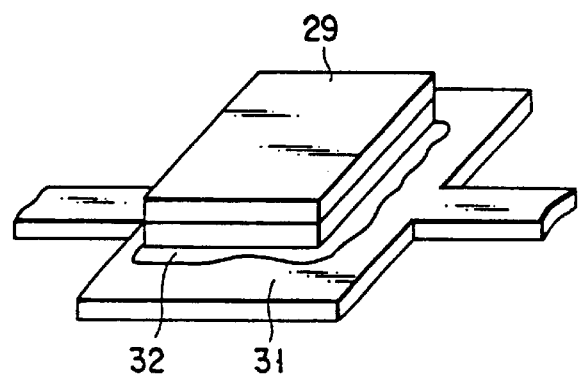
FIG. 14 illustrates the method of manufacturing the semiconductor device according to the first embodiment and is, specifically, a perspective view illustrating a die bonding step.
Figure 15:
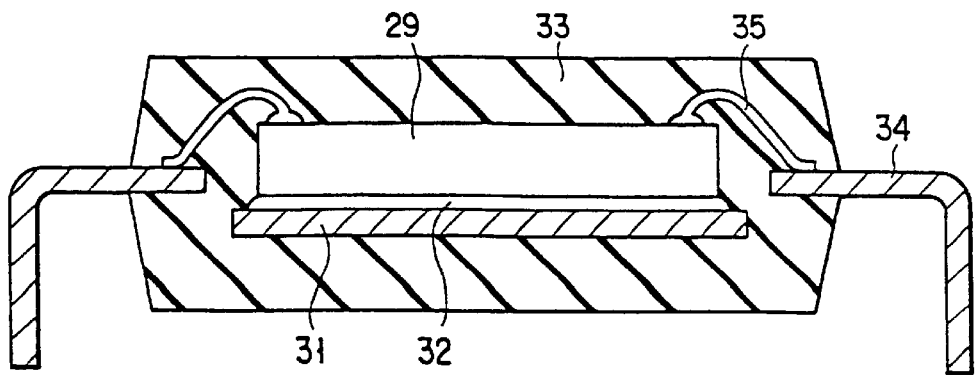
FIG. 15 illustrates the method of manufacturing the semiconductor device according to the first embodiment and is, specifically, a cross-sectional view illustrating a step of sealing the chip in a package.

FIGS. 8 to 15 illustrate a wafer dividing method and a semiconductor device manufacturing method according to a first embodiment of the present invention. Specifically, FIG. 8 illustrates a step of forming grooves in a wafer along dicing lines; FIG. 9 is an enlarged sectional view of a groove; FIGS. 10A and 10B illustrate a step of attaching a surface protection tape to the wafer; FIG. 11 illustrates a step of lapping and polishing the rear surface of the wafer (a dividing step); FIG. 12 is a diagram showing how the measurements of the average diameter of the particles of the chipping on the reverse side of the wafer vary when the ratio of the lapping and polishing amount, required to attain the finished chip thickness after the lapped face reaches the bottom of the groove in the process of removing the rear side of the wafer, to the depth of the curved bottom surface of the groove is changed; FIG. 13 illustrates a step of picking up separated chips; FIG. 14 illustrates a die bonding step; and FIG. 15 illustrates a step of sealing the chip in a package.

First, as shown in FIG. 8, a wafer 21 on which various semiconductor elements are formed is fixed on a chuck table 23 of a dicing apparatus by means of a vacuum suction, etc., with a pattern formation surface (major surface of wafer 21) 21' situated upward. A dicing blade 24 is rotated at a predetermined rotational speed to cut grooves 22 along dicing lines to a predetermined depth while a cutting water being applied. The depth of each groove 22 is greater than the thickness of a finished chip by at least 5 $\mu$m, preferably by 5 to 60 $\mu$m.

As a result, a groove 22 having a width D (which corresponds to the width of the dicing blade 24) and having a curved bottom surface is formed, as shown in FIG. 9. The depth of the curved bottom surface of the groove 22 is indicated by B (which corresponds to the length of the curved-surface portion at the tip end of the dicing blade 24).

The grooves 22 need not be formed in a mechanical way using the dicing blade 24 described above. They may be formed in a chemical way, such as by etching. For example, isotropic etching and anisotropic etching can be combined to form a groove 22 having such a cross sectional shape as shown in FIG. 9. To be more specific, the major surface 21' of the wafer 21 is coated with photoresist, and chip parting lines (corresponding to dicing lines) are exposed in a PEP process or the like. Thereafter, the wafer 21 is immersed in a KOH solution, thereby selectively etching the wafer 21 in the depth direction thereof (i.e., in the direction perpendicular to the major surface of the wafer 21). As a result of this selective etching, grooves are formed in the wafer 21. In place of the wet etching using the KOH solution, dry etching technology, such as RIE (reactive ion etching), is applicable. For example, only the silicon can be selectively etched by using etching gases, such as an $SF_6$ gas and a mixture gas of $SF_6/CF$, in a vacuum (the degree of vacuum: 60 mtorr). In particular, the use of the mixture gas of $SF_6/CF$ enables reliable anisotropic etching, so that grooves can be formed in the direction substantially perpendicular to the major surface 21' of the wafer 21. Then, the bottom of the groove is isotropically, thereby forming a groove having a curved surface at the bottom, as shown in. FIG. 9.

In comparison with the case where the dicing blade 24, such as a diamond blade, is used, the groove formation method using etching is advantageous in that the side walls of the grooves 22 (i.e., the side surfaces formed by etching)

are not subjected to mechanical stress. This means that crystal defects, which are likely to be generated in side surfaces formed by cutting, can be reduced. Needless to say, the mechanical and chemical methods described above are not the only method available. For example, the grooves 22 may be formed in an optical method using a laser scriber. With respect to the step shown in FIG. 8, the method in which the grooves 22 are formed does not matter. What is important in connection therewith is that the depth of the grooves 22 is greater than the thickness of a finished chip by at least 5 µm (the depth of the grooves 22 must not be so great as to divide the wafer 21 into chips).

Then, the wafer 21, in which the grooves 22 are formed, are cleaned and dried.

A flat ring 25, as shown in FIG. 10A, is attached to a surface protection tape (adhesive sheet) 26 for protecting the pattern formation surface of wafer 21. With a slack or wrinkles of the tape 26 removed, a pattern formation surface 21' of the wafer 21 in which the grooves were formed in the preceding step is fixed on the adhesive side of the tape 26, as shown in FIG. 10B.

Subsequently, as shown in FI(G. 11, the wafer 21 held by the flat ring 25 and surface protection tape 26 is fixed on a chuck table 27 of a lapping apparatus by means of a vacuum suction, etc. The rear side of the wafer 21 is lapped while the chuck table 27 and a grindstone 28 are being rotated and the grindstone 28 is being lowered. This lapping method is generally called "in-field lapping". Alternatively, a through-field lapping method or a creep field lapping method, wherein the wafer is lapped while the wafer 21 and grindstone 28 are being rotated, may be adopted. When the rear side of the wafer 21 has been lapped as far as the grooves 22, the wafer 21 is divided into chips 29. In this invention, the lapping is continued even after the wafer 21 has been divided into the chips 29, the wafer is lapped until the thickness of the finished chip (a finished chip thickness) is attained. At the time, the ratio (A/B) of the lapping and polishing amount A to depth B is controlled to be not less than 0.3. The lapping and polishing amount A is an amount by which the wafer has to be abraded to attain the thickness of the finished chip after the lapping or lapped face reaches the bottom of the groove 22, and the depth B corresponds to the depth or length of the curved-surface region at the bottom of the groove 22.

FIG. 12 shows how the measurements of the average diameter of the particles of the chipping on the reverse side of the wafer vary when the ratio (A/B) of a lapping and polishing amount (A), required to attain the finished chip thickness after the lapped face reaches the bottom of the groove in the process of removing the rear side of the wafer, to the depth (B) of the curved-surface region of the bottom of the groove is changed. As shown in FIG. 12, when the bottom of the groove 22 flat, chipping of particles of 14 µm or so are generated on the average. The chipping is of large size when ratio A/B is not greater than 0.3, and are smaller than 14 µm when the ratio A/B is greater than 0.3. The average diameter of the particles of the chipping is 5 µm when the ratio A/B is 1 or so.

As described above, even if chipping is generated in regions where the cut face formed by dicing and the polished face formed by lapping and polishing meet each other, such chipping can be easily removed by lapping and polishing the regions. In addition, since the bottom surface of each groove 22 is curved, the arch shape of the groove bottom provides the wafer 21 with a remarkable mechanical strength when the wafer 21 is lapped and polished. In addition, silicon chipping is prevented immediately before the wafer is divided into chips, damage to the end faces of the chips is prevented, and the chips are thereby improved in quality. It should be also noted that the lapping and polishing amount required to attain the thickness of the finished chip after a lapped face of the wafer reaches the bottom surface of the groove, and a depth of a region of the curved bottom (surface defines a ratio of not less than 0.3. Owing to this, the average diameter of the particles of the chipping produced in the lapping and polishing step is as small as possible, thus further improving the chip quality. Moreover, since the depth of each groove is greater than the thickness of a finished chip by 5 to 60 µm, quality deterioration, such as unseparation, can be prevented, and the lapping and polishing amount can be optimal. Hence, abnormal abrasion can be suppressed with no need to sacrifice the productivity. Thus, the present invention enables the finished chip 29 to be as thin as 30 to 50 µm.

When the rear side of the wafer 21 is lapped as far as the grooves 22 so as to divide the wafer 21 into chips, a grindstone having grinding particles of only one kind may be used. In order to attain a short grinding time and suppress the generation of chipping, however, it is preferable to employ two kinds of grindstones having different particle diameters. In addition, the rear side of the wafer 21 is desirably lapped in two or more steps. To be more specific, the lapping and polishing process is executed first by use of a grindstone whose grinding particles are #360 or so (the diameters of the major grinding particles are in the range of 40 to 60 µm and then by use of a small-particle grindstone whose grinding particles are #2000 or so (the diameters of the major grinding particles are in the range of 4 to 6 µm). By executing the lapping and polishing process in this manner, the time required for the wafer to be divided into chips 29 can be as short as possible. In addition, the grindstone used when the wafer 21 is finally divided into chips 29 is the small-particle type. Accordingly, the generation of chipping can be suppressed.

As is shown in FIG. 13, the flat ring 25 and tape 26, on which the chips 29 diced from the wafer 21 are mounted, are placed on a die bonding apparatus. A downward pressure is applied to the pattern formation surface 22 via the surface protection tape 26 by a pickup needle 30 of the die bonding apparatus. Thereby, the pickup needle 30 pushes the pattern formation surface of the chip 29, without penetrating the tape 26, and the chip 29 is separated from the tape 26. The inventors confirmed that when the radius of curvature of the tip portion of the pickup needle 30 was 0.35 mm or more, no damage was caused on aluminum wiring, etc. in the chip 29 even when a force of 18 N was applied (in the case of a chip with a size of 15 mm×15 mm). Thus, even if the pickup needle 30 (metallic pin) pushes the major surface of chip 29 with the surface protection tape 26 interposed, the pickup needle 30 does not break the tape 26 if the radius of curvature of the tip portion of the pickup needle 30 is optimized, and there arises no problem. In the present embodiment, when the chip 29 is separated from the tape 26, the chip 29 is pushed down. However, the chip 29 may be pushed up, as is widely adopted in the field of the art.

The chip 29 separated from the tape 26 is held by a tool called "collet" of the die bonding apparatus and mounted on an island 31 of a lead frame, as shown in FIG. 14. In this case, a conductive paste 32 for fixing is coated on the island 31 of the lead frame in advance, and the chip 29 is die-bonded on the island 31. Alternatively, the chip 29 may be mounted by using a gold-silicon eutectic, or by depositing a metal thin film on the rear side of the wafer and using solder.

Thereafter, the pads of the chip 29 are electrically connected to the inner lead portions of the lead frame 34 by means of bonding wires 35 in a wire bonding step. The chip 29, island 31 and inner lead portions of lead frame 34 are sealed in a package 33 of a resin (or ceramic). Then, lead forming is performed and a semiconductor device, as shown in FIG. 15, is obtained.

Figure 16A:
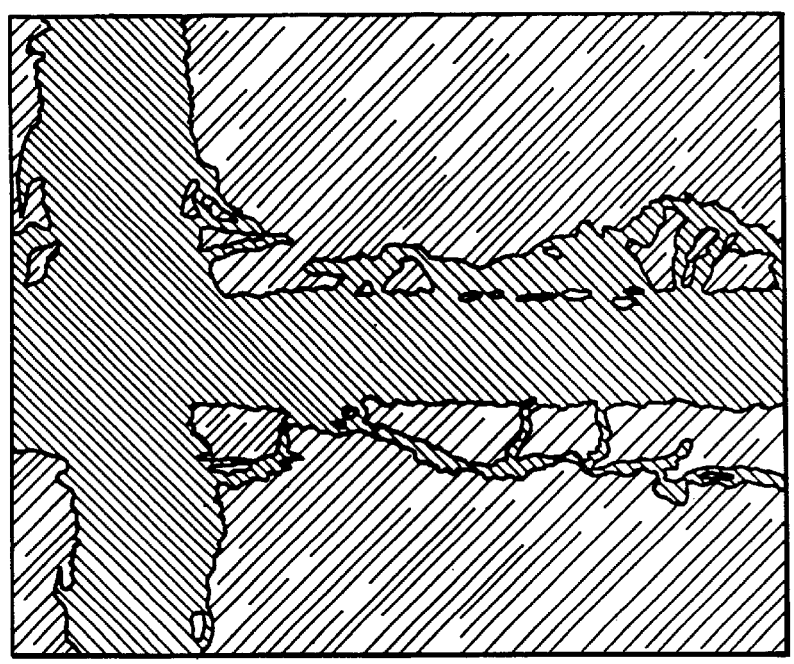
FIG. 16A is an enlarged view of lapped faces of the wafers diced into chips in the conventional method.
Figure 16B:
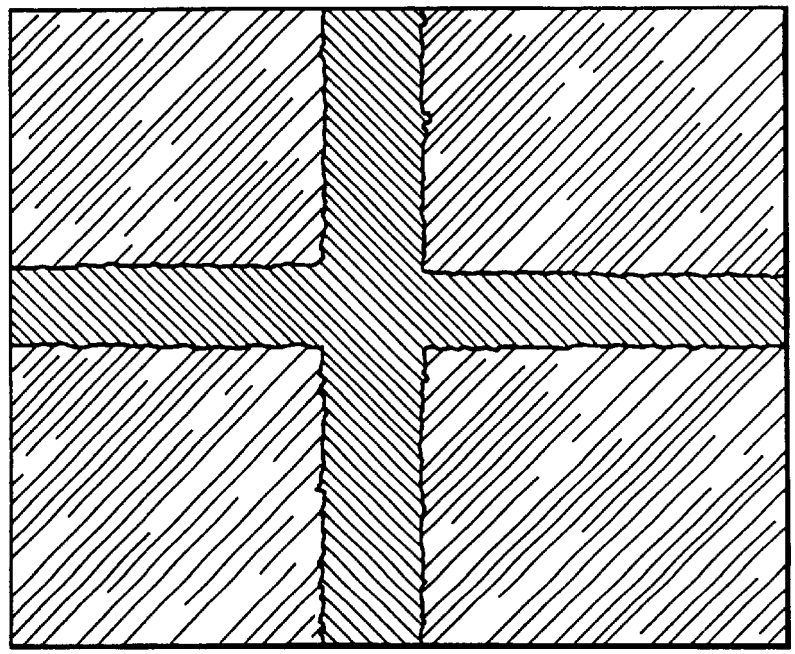
FIG. 16B is an enlarged view of lapped faces of the wafers diced into chips in the method of the present invention.

FIGS. 16A and 16B are enlarged views of lapped faces of chips diced from the wafer. FIG. 16A is an enlarged view of lapped faces formed by full-cut dicing according to the conventional dividing method and manufacturing method. As shown in FIG. 16A, a great number of chippings occur in the diced region. FIG. 16B shows the case of the dividing method and manufacturing method according to the present invention. As compared to FIG. 16A, the diced faces are sharp and the degree of chipping is greatly reduced.

In relation to the depth of a groove 22, the accuracy of the lapping portion of the rear surface lapping apparatus and the accuracy of the thickness of the protective tape member are verified. The results of this verification are shown in Table 1. As shown in Table 1, when the depth of the groove 22 is equal (0) to or not greater than 5 μm, the reverse surfaces of the chips are not satisfactory, and unseparation occurs in the worst case. In the next pickup step, therefore, the chips are picked up while causing cracks, thus giving marked damage to the reverse sides of the chips.

Figure 17:
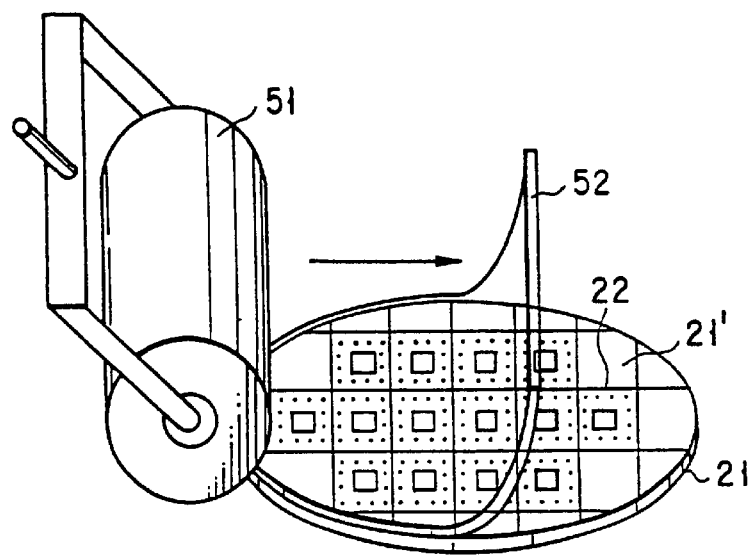
FIG. 17 illustrates a modification of the method of manufacturing the semiconductor device according to the first embodiment and is, specifically, a perspective view illustrating the step of attaching a surface protection tape to the wafer.
Figure 18:
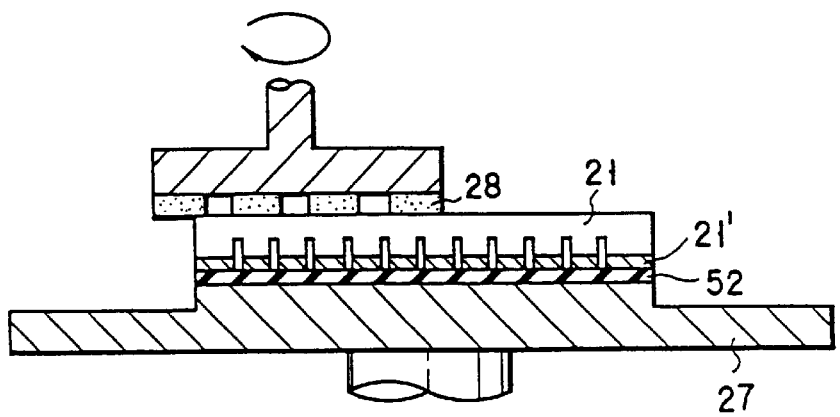
FIG. 18 illustrates a modification of the method of manufacturing the semiconductor device according to the first embodiment and is, specifically, a cross-sectional side view illustrating a step of lapping and polishing the rear surface of the wafer (a dividing step)
Figure 19A:
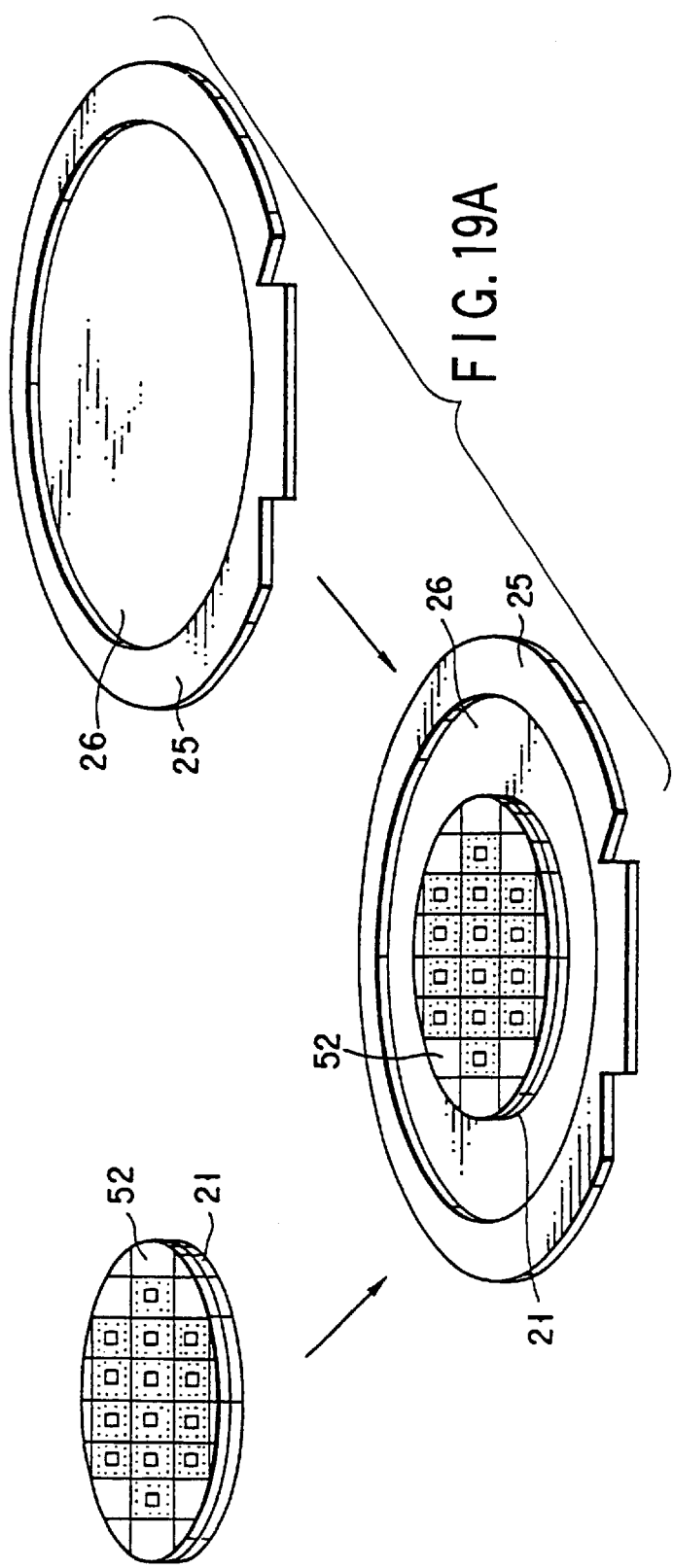
FIG. 19A illustrates a modification of the method of manufacturing the semiconductor device according to the first embodiment, and is, specifically, a perspective view showing the transfer step for divided chips (a tape changing step) and illustrating a step of attaching the reverse side of a wafer onto the adhesive sheet of a flat ring.
Figure 19B:
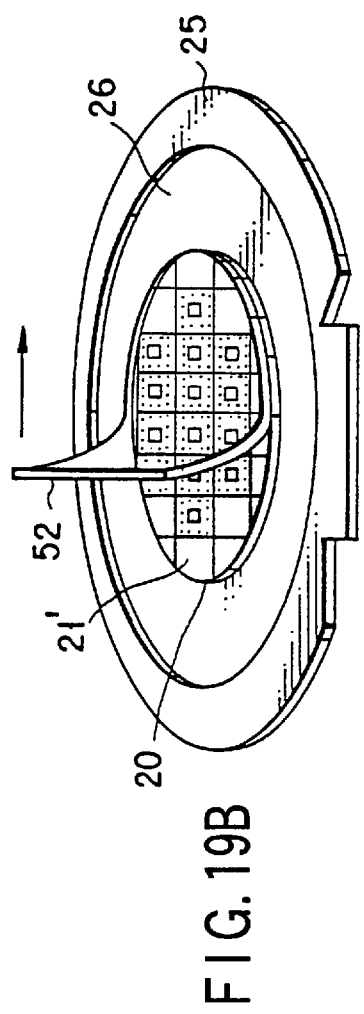
FIG. 19B illustrates a modification of the method of manufacturing the semiconductor device according to the first embodiment, and is, specifically, a perspective view showing the transfer step for divided chips (a tape changing step) and illustrating a step of separating a surface protection tape.

If the lapping and polishing amount is 60 μm or larger, the time needed for abrasion is inevitably long, resulting in poor productivity. In particular, when rough lapping and finish lapping are executed to make the dividing time short and improve the chip quality, it is required that the working rate of the finish lapping be ⅕ to ¹⁄₁₀ that of the rough lapping. In addition, the groove 22 cannot be set to be very deep since a large lapping and polishing amount is likely to cause an undesirable abraded face (for example, the material of the grindstone will attach to the abraded face of the wafer), which phenomenon is inevitable in view of the property of the grindstone used for finish lapping. It should be also noted that biaxial separation is required for increasing the lapping and polishing amount. If this is done, however, the lapping and polishing amount in which the wafer is abraded biaxially at low rate is inevitably large, resulting in a noticeable decrease in productivity. Moreover, since an increase in the biaxial lapping and polishing amount, the load imposed on the grindstone is heavy, and abnormal abrasion is therefore likely to occur. Hence, the depth of the groove 22 should not be greater than 60 μm. As indicated in Table 1 below, abnormal abrasion occurs if the depth of the groove 22 is 80 μm.

a flat ring 25 is then attached to the surface protection tape 26 on the pattern formation surface, as shown in FIGS. 10A and 10B. The wafer 21, which is then held by the flat ring 25 and the surface protection tape 26, is fixed on the chuck table 27 of the lapping apparatus by vacuum suction, and in this state the rear surface of the wafer 21 is lapped and polished. It should be noted, however, that the flat ring 25 is not necessarily required in the step of lapping and polishing the rear surface of the wafer 21. That is, the flat ring can be omitted, as can be seen from FIGS. 17 and 18. More specifically, grooves 22 are first formed in the wafer 21 in such a step as is shown in FIG. 8, and then a surface protection tape (an adhesive sheet) 52 is attached to the pattern formation surface (major surface) 21' of the wafer 21 by moving the roller 51 in the direction indicated by the arrow in FIG. 8. Subsequently, the wafer 21, the major surface of which is protected by the surface protection tape 52, is fixed on the chuck table 27 of the lapping apparatus by vacuum suction or the like, as shown in FIG. 18. Since a flat ring is not used, the entirety of the wafer 21 has to be sucked in a "flat" state. Subsequently, the chuck table 27 and the grindstone 28 are rotated, and the rear surface of the wafer 21 is lapped by moving the grindstone 23 downward. When the rear surface of the wafer 21 has been lapped to the grooves 22, the wafer 21 is divided into chips. Even after the wafer 21 is divided into chips 29, the lapping and polishing process is continued until the wafer is lapped by at least 5 μm or more. Then, as shown in FIG. 19A, the rear surface of the wafer 21, which is divided into chips 29 in the preceding step but is held to be a one body by the surface protection tape 52, is attached to the adhesive sheet 26 of the flat ring 25. Thereafter, the surface protection tape 52 is separated from the wafer 21, as shown in FIG. 19B. The subsequent steps are similar to those shown in FIGS. 13 to 15.

The chips 29 that are picked up in the step shown in FIG. 13 need not be immediately subjected to a die bonding step, a wire bonding step, a packaging step, etc. so as to complete the fabrication of a semiconductor device. Instead of those steps, the picked-up chips 29 may be packed on a tray.

Second Embodiment

Figure 20:
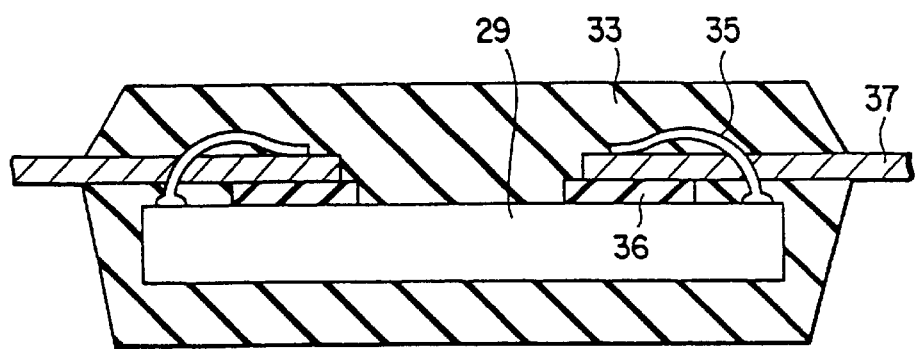
FIG. 20 illustrates a method of manufacturing a semiconductor device according to a second embodiment of the present invention and is, specifically, a cross-sectional view of the semiconductor device applied to a LOC package.

FIG. 20 illustrates a method of manufacturing a semiconductor device according to a second embodiment of the present invention, wherein the invention is applied to an LOC (Lead On Chip) package. In the case of an LOC package, the chip that is picked up, as shown in FIG. 13, is sealed in the following manner. An adhesive tape 36 is provided on the chip 29, and one end portion of a lead 37 is attached to the adhesive tape 36. Then, each pad of the chip

TABLE 1

| Depth of Groove (Thickness of Finished Chip + μm) | 0 μm | 2 μm | 5 μm | 20 μm | 40 μm | 60 μm | 80 μm |
|---|---|---|---|---|---|---|---|
| Shape of Reverse Side | Occurrence of Unseparation | Remaining R-shape | ○ | ○ | ○ | ○ | ○ |
| Quality in Lapping | ○ | ○ | ○ | ○ | ○ | ○ | Abnormal Abrasion |

As can be seen from the above, the desirable depth of a groove is in the range from (finished chip thickness+5 μm) to (finished chip thickness+60 μm).

In the first embodiment described above, grooves 22 are first formed in the wafer 21 in the step shown in FIG. 8, and 29 and the associated lead 37 are electrically connected by means of a bonding wire 35 in a wire bonding process. The resultant structure is sealed in a resin package 33 or a ceramic package. Thus, a semiconductor device as shown in FIG. 20 is obtained.

In this case, if silicon waste is present on the chip 29, it may break the surface protection film of the chip due to a load at the time of adhesion of the lead 37 or wire bonding. As a result, breakage of aluminum wiring or short-circuit may be caused. To solve this problem, the adhesive tape 36 is made thicker than the silicon waste.

According to the above-described wafer dividing methods and semiconductor device manufacturing methods, the following advantages (1) to (6) can be obtained.

(1) The proportion of defective wafers due to damage at the time of thinning wafers can be reduced.

Table 2 shows the relationship between the chip thickness (substantially equal to or slightly less than the depth of the groove) of each chip diced from a 6-inch (diameter) wafer and the breakage ratio (ppm: parts per million).

TABLE 2

| Chip thickness ($\mu$m) ($\approx$ depth of groove) | 450 | 350 | 290 | 200 | 100 | 50 |
|---|---|---|---|---|---|---|
| Prior art (ppm) | 180 | 250 | 600 | 1000 | 5000 | 60000 |
| Present invention (ppm) | 20 | 20 | 0 | 0 | 0 | 0 |

Figure 1:
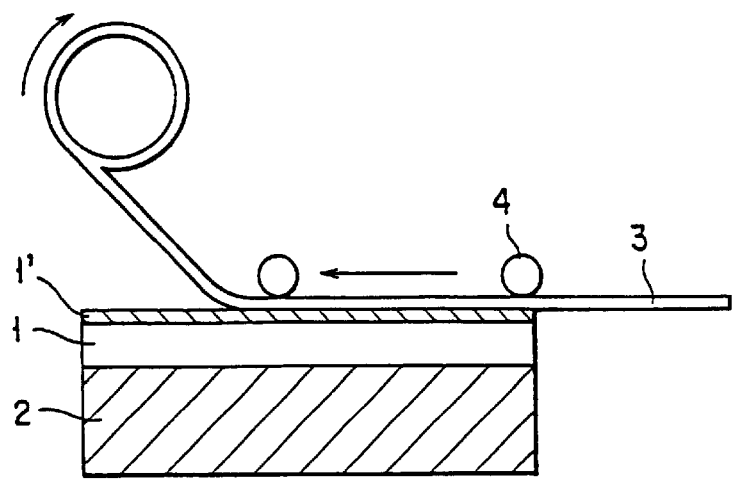
FIG. 1 illustrates a conventional method of manufacturing a semiconductor device and is, specifically, a cross-sectional side view illustrating a step of attaching a surface protection tape on a wafer.
Figure 2:
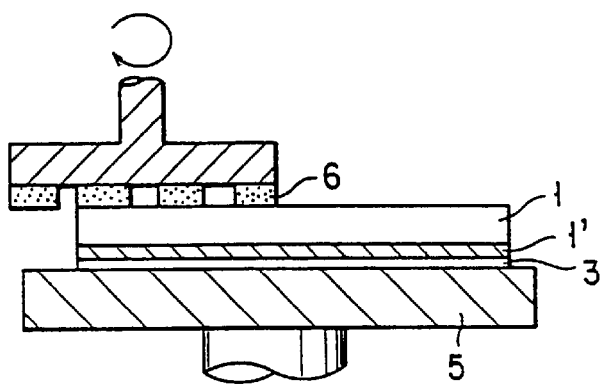
FIG. 2 illustrates the conventional method of manufacturing the semiconductor device and is, specifically, a cross-sectional side view illustrating a step of lapping and polishing a rear surface of the wafer.
Figure 3:
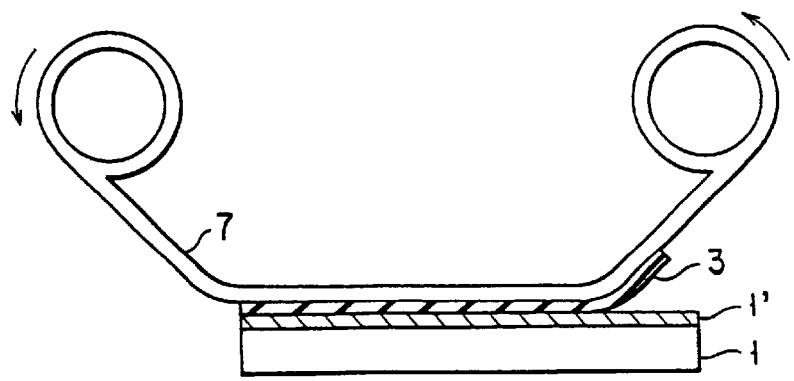
FIG. 3 illustrates the conventional method of manufacturing the semiconductor device and is, specifically, a cross-sectional side view illustrating a step of separating the surface protection tape.
Figure 4A:
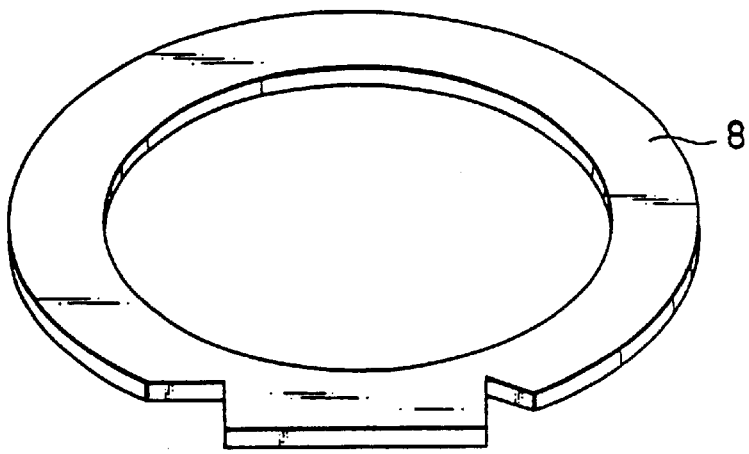
FIG. 4A illustrates the conventional method of manufacturing the semiconductor device and is, specifically, a perspective view of a flat ring.
Figure 4B:
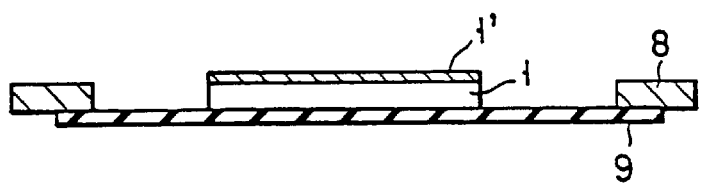
FIG. 4B illustrates the conventional method of manufacturing the semiconductor device and is, specifically, a cross-sectional side view illustrating the state in which the wafer is fixed on a fixing sheet.
Figure 5:
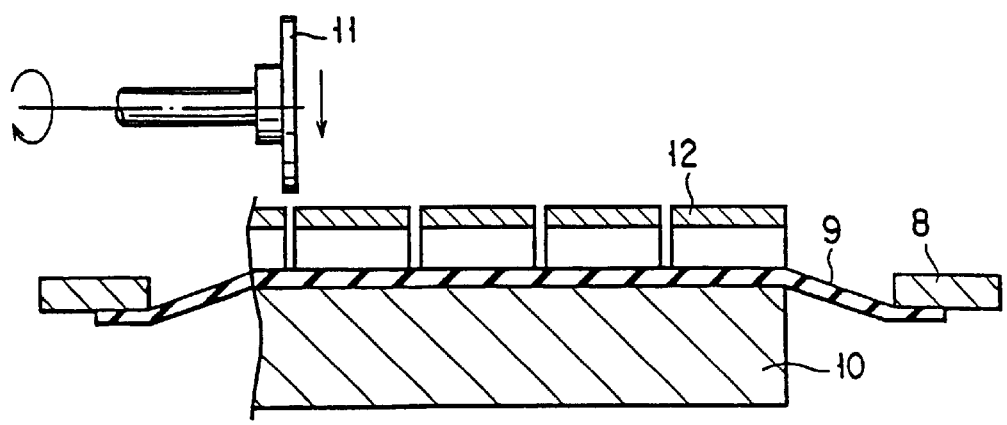
FIG. 5 illustrates the conventional method of manufacturing the semiconductor device and is, specifically, a cross-sectional side view illustrating a step of dicing the wafer.
Figure 6:
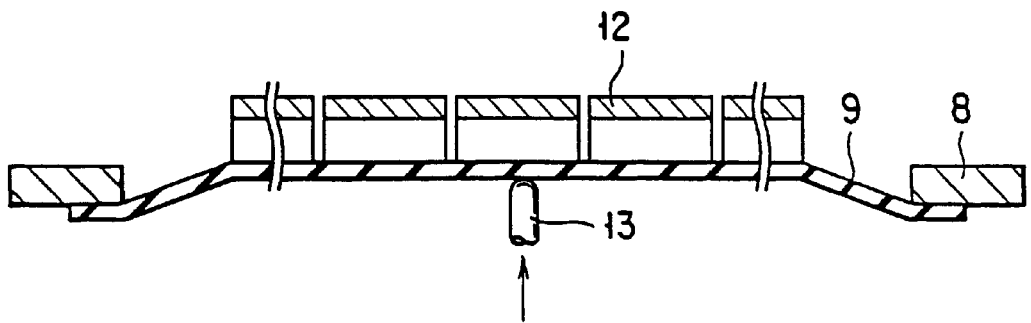
FIG. 6 illustrates the conventional method of manufacturing the semiconductor device and is, specifically, a cross-sectional side view illustrating a step of picking up separated chips.
Figure 7:
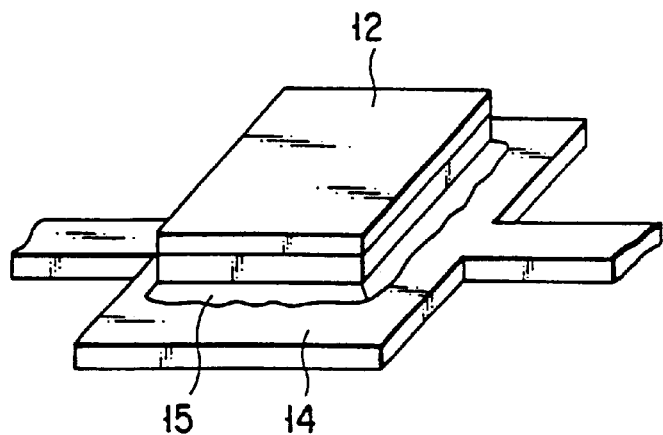
FIG. 7 illustrates the conventional method of manufacturing the semiconductor device and is, specifically, a perspective view illustrating a die bonding step.

As is shown in Table 2, in the prior art, the breakage ratio increases as the chip thickness decreases. By contrast, in the present invention, the breakage ratio decreases as the final chip thickness decreases. The reason is that if the chip thickness is decreased, the depth of the groove can be reduced, and therefore the wafer thickness below the groove can be increased. In the case of the wafer with the diameter of 6 inches, the thickness of the wafer is generally 600 to 650 $\mu$m. In the conventional dividing method and manufacturing method, when a chip with a thickness of, e.g. 50 $\mu$m is to be formed, the wafer is lapped and polished in advance to a thickness of 50 $\mu$m, and the process illustrated in FIGS. 1 to 3 is performed. By contrast, in the method of the present invention, after the grooves of 50 $\mu$m in depth are formed (the wafer portion of 550 to 600 $\mu$m remains below each groove), the wafer is lapped and polished and thus divided into chips. Thus, the breakage ratio in the present invention decreases.

(2) Troubles at the time of transfer do not depend on the diameter of the wafer. According to the present invention, the wafer is divided into chips simultaneously with the lapping process. Even if the chip is thin, or even if the diameter of the wafer is unchanged, the wafer can be transferred within the apparatus without influence of warp of the wafer due to dicing distortion. In addition, if the chip thickness is decreased, the wafer portion below the grooves is made thicker. From this point, too, the breakage ratio of wafers at the time of transfer can be decreased. Thereby, the advantage as shown in Table 3 below can be obtained. In this case, the diameter of the wafer is 8 inches, and the thickness of a finished chip is 50 $\mu$m.

TABLE 3

| | Prior art | Present invention |
|---|---|---|
| Decrease in number of transfer troubles (ppm) | 80000 | 50 |

TABLE 3-continued

| | Prior art | Present invention |
|---|---|---|
| Storage ratio to carrier (index) | 1 | 2 |

As is clear from data in Table 3, the present invention is advantageous in the use of wafers with greater diameters. This invention is easily applied to 12-inch wafers or 16-inch wafers which will be used in future.

(3) Since only one surface protection tape is used, the cost for material and processing can be reduced by 60%, as compared to the conventional method. Thus, the manufacturing cost can be reduced.

(4) In the case of the full-cut method, not only the wafer but also the sheet is cut. As a result, the cutting performance of the blade deteriorates and cutting waste flies during the dicing step. In general, the dicing speed in the full-cut method is 80 to 120 mm/sec. In the present invention, the dicing speed can be increased up to 200 mm/sec. Therefore, the dicing speed can be increased, and the processing cost can be reduced by about 10%.

(5) In order to divide the wafer, there is no need to perform cutting as deep as the dicing sheet. In addition, the grindstone for lapping the rear surface of the wafer is used to divide the wafer. Thus, the size of chipping on the rear surface decreases from about 15 $\mu$m, as in the prior art, to about 4 $\mu$m. Furthermore, the breaking strength is increased from 520 MPa, as in the prior art, up to 600 MPa.

Where a wafer is divided into chips by the lapping and polishing of the rear surface of the wafer, the amount of chipping generated from the rear surface varies, depending upon the diameters of the grinding diamond particles of the grindstone used. As can be seen from Table 4 below, when the diameters of the diamond particles are small, the amount of chipping generated from the rear surface of the wafer is small, and the breaking strength of the chips is improved. This being so, the diamond particle diameters of the grindstone used for dividing a wafer into chips should be as small as possible. As described above, where a grindstone having large-diameter grinding particles and a grindstone having small-diameter grinding particles are used in combination, the generation of chipping can be reduced, and yet the time required for lapping and polishing the wafer can be as short as possible.

TABLE 4

| | Present invention | | Prior art |
|---|---|---|---|
| Distribution of diamond particles ($\mu$m) | 4–6 | 40–60 | 4–6 |
| Average chipping from rear surface ($\mu$m) | 3.2 | 8.76 | 13.8 |
| Maximum chipping from rear surface ($\mu$m) | 23 | 55 | 53 |
| Average value of breaking strength of chips (MPa) | 669.0 | 560.4 | 505.5 |

Figure 21:
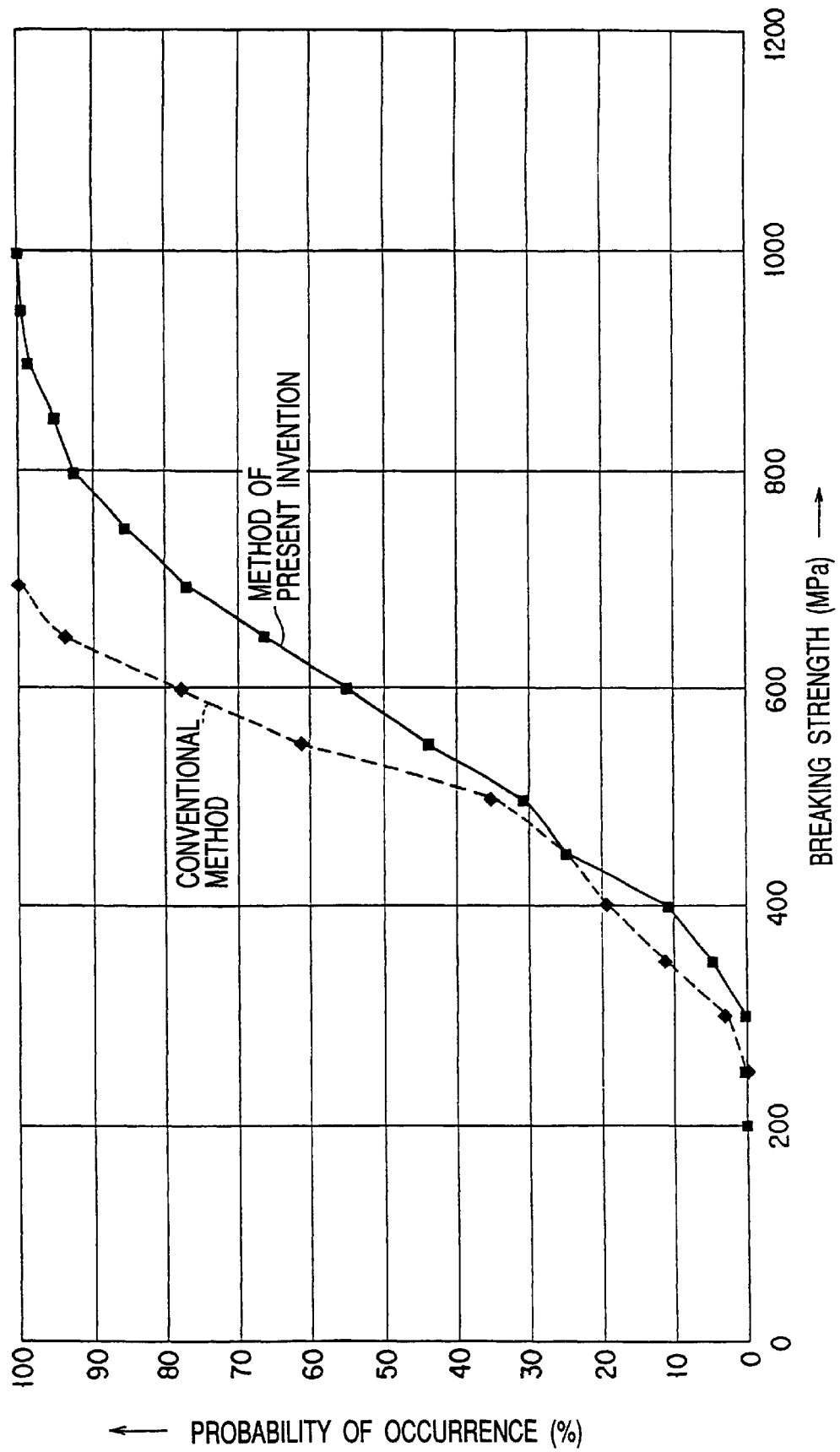
FIG. 21 is a diagram comparing breaking strength distributions obtained with the conventional method and the method of the present invention.

FIG. 21 is a diagram comparing breaking strength distributions obtained with the conventional method and the method of the present invention. Specifically, FIG. 21 shows the probability of occurrence (%) of chipping at each breaking strength (200 MPa to 1000 MPa). As is clear from FIG. 21, in the separating method of the present invention, as compared to the separating method in the prior art, the probability of occurrence of chipping decreases if the breaking strength is unchanged. That is, the breaking strength is increased. The average value of breaking strength in the conventional method is about 520 MPa, whereas the average value of breaking strength in the method of the present invention is about 600 MPa.

(6) In order to divide the wafer, there is no need to perform cutting as deep as the dicing sheet. Thus, the wear of the dicing blade is reduced, and the life of the dicing blade can be increased. For example, in the case of the method in which cutting is performed as deep as the dicing sheet, the life of the blade is normally 10000 to 20000 lines (in the case of a 6-inch wafer). In the method of the present invention, the life can be increased up to 80000 lines or more.

Third Embodiment

Figure 22C:
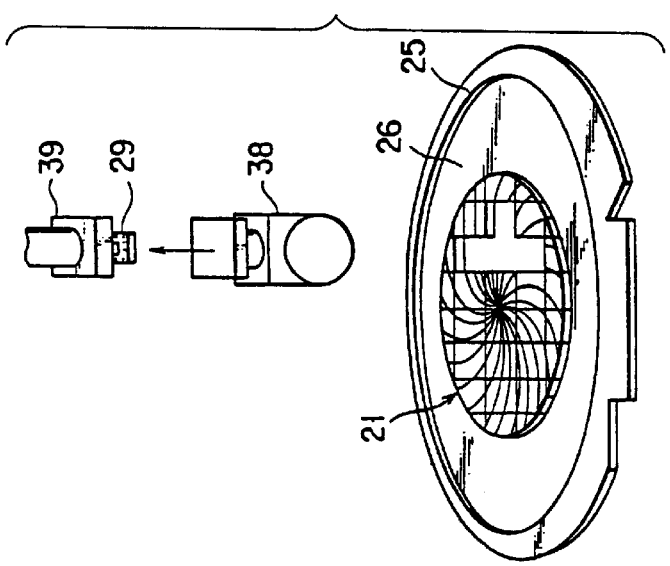
FIGS. 22A to 22E illustrate a method of manufacturing a semiconductor device according to a third embodiment of the present invention and are, specifically, perspective views illustrating in succession steps of mounting divided chips on lead frames.
Figure 22B:
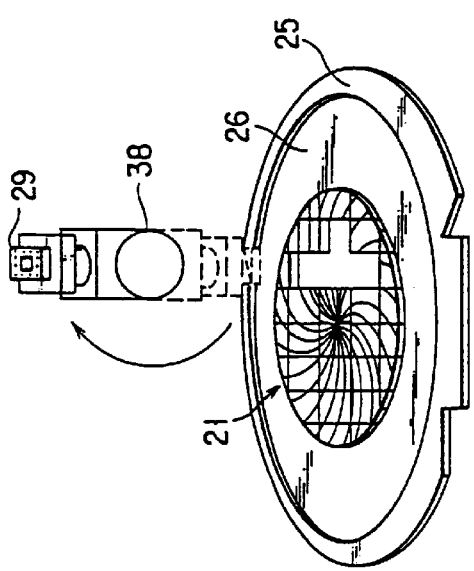
Figure 22A:
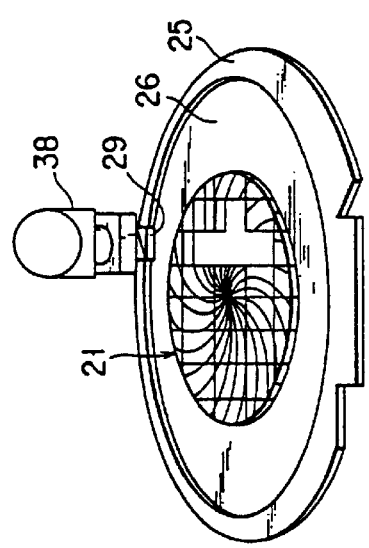
Figure 22E:
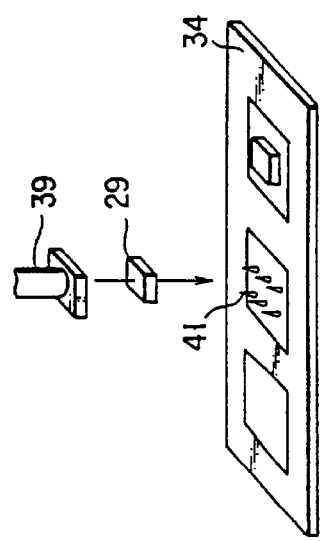
Figure 22D:
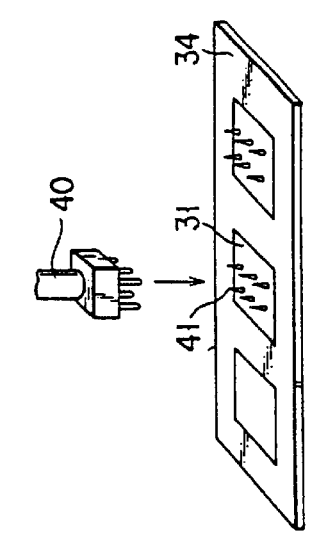

FIGS. 22A to 22E illustrate a method of manufacturing a semiconductor device according to a third embodiment of the present invention and are, specifically, perspective views illustrating in succession steps of mounting divided chips on lead frames. Like the first embodiment, the wafer 21 is divided into chips 29 through the steps illustrated in FIGS. 8 to 11. The flat ring 25 and tape 26, on which the divided chips 29 are adhered and fixed, are removed from the chuck table 27 of the lapping apparatus. Then, as shown in FIG. 22A, the chip 29 is picked up. In this case, the chip 29 is pushed up by the pickup needle from below, with the surface protection tape 26 interposed. Thus, the chip 29 is separated from the surface protection tape 26, and the rear surface of the chip 29 is adsorbed by a collet 38. The collet 38 has a chip inverting mechanism. As is shown in FIG. 22B, the collet 38 is rotated by 180° so that a downward adsorber is directed upward. In this state, the chip 29 is transferred to another collet 39, as shown in FIG. 22C, by using an aerial chip transfer mechanism. Thereby, the upper and lower sides of the chip 29 are reversed, and the major surface (pattern formation surface) is directed upward. Then, as shown in FIG. 22D, a conductive paste 41 is applied to an island 31 of the lead frame 34 by a dispenser 40. The chip 29 held by the collet 39 is moved onto the island 31 of lead frame 34, as shown in FIG. 22E. Thus, the chip 29 is die-bonded to the island 31.

Fourth Embodiment

FIGS. 23A to 23C illustrate a method of manufacturing a semiconductor device according to a fourth embodiment of the present invention and are, specifically, perspective views illustrating in succession steps of mounting divided chips on lead frames. Like the first embodiment, the wafer 21 is divided into chips 29 through the steps illustrated in FIGS. 8 to 11. The flat ring 25 and tape 26, on which the divided chips 29 are adhered and fixed, are removed from the chuck table 27 of the lapping apparatus. The chips 29, as shown in FIG. 23A, are transferred and attached to the surface of a surface protection tape 42 attached to a flat ring 43. Thereby, the upper and lower sides of the chip 29 are reversed and the major surface of the chip 29 is directed upward. Then, as shown in FIG. 23B, a conductive paste 41 is applied to the island 31 of the lead frame 34 by the dispenser 40. Subsequently, as shown in FIG. 23C, like the prior art, the pattern formation surface of the chip 29 is pushed from below by the pickup needle, with the surface protection tape 42 interposed. Thus, the chip 29 is separated from the surface protection tape 42. The separated chip 29 is picked up by a collet 42, and the chip 29 is moved onto the island 31 of lead frame 34 coated with the conductive paste 41. Thus, the chip 29 is die-bonded to the island 31.

Fifth Embodiment

Figure 24C:
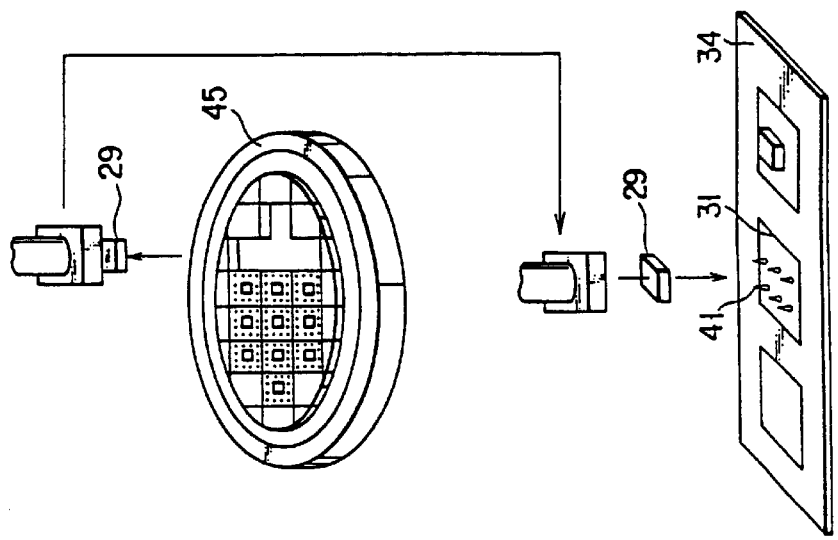
FIGS. 24A to 24C illustrate a method of manufacturing a semiconductor device according to a fifth embodiment of the present invention and are, specifically, perspective views illustrating in succession steps of mounting divided chips on lead frames.
Figure 24B:
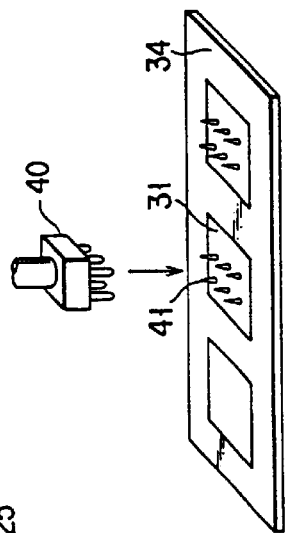
Figure 24A:
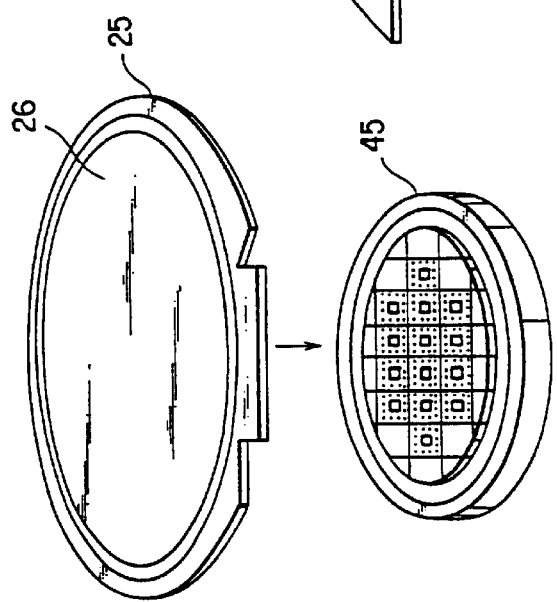

FIGS. 24A to 24C illustrate a method of manufacturing a semiconductor device according to a fifth embodiment of the present invention and are, specifically, perspective views illustrating in succession steps of mounting divided chips on lead frames. Like the first embodiment, the wafer 21 is divided into chips 29 through the steps illustrated in FIGS. 8 to 10. The flat ring 25 and tape 26, on which the divided chips 29 are adhered and fixed, are removed from the chuck table 27 of the lapping apparatus. The chips 29, as shown in FIG. 24A, are transferred and attached to a porous chuck table 45. Thereby, the upper and lower sides of the chip 29 are reversed and the major surface of the chip 29 is directed upward. Then, as shown in FIG. 24B, a conductive paste 41 is applied to the island 31 of the lead frame 34 by the dispenser 40. Subsequently, as shown in FIG. 24C, the chip 29 is picked up from the porous chuck table 45. The pickedup chip 29 is moved onto the island 31 of lead frame 34. Thus, the chip 29 is die-bonded to the island 31.

According to the fifth embodiment of the invention, the chip 29 can be picked up without using the pushing pin.

Sixth Embodiment

FIGS. 25A to 25E illustrate a method of manufacturing a semiconductor device according to a sixth embodiment of the present invention and are, specifically, perspective views illustrating in succession steps of mounting divided chips on lead frames. Like the first embodiment, the wafer 21 is divided into chips 29 through the steps illustrated in FIGS. 8 to 10. The flat ring 25 and tape 26, on which the divided chips 29 are adhered and fixed, are removed from the chuck table 27 of the lapping apparatus. The chips 29, as shown in FIG. 25A, are picked Up by a collet 38. In this case, the chip 29 is pushed up by the pickup needle, with the surface protection tape 26 interposed. Thus, the chip 29 is separated from the surface protection tape 26 and adsorbed by the collet 38. The collet 38 has a chip inverting mechanism. As is shown in FIG. 25B, the collet 38 is rotated by 180° so that a downward adsorber is directed upward. In this state, the chip 29 is transferred to another collet 39 by using an aerial chip transfer mechanism. Then, the collet 39 is moved and, as shown in FIG. 25C, attached to the surface of a surface protection tape 46 attached to a flat ring 47. Thereby, the upper and lower sides of the chip 29 are reversed, and the major surface (pattern formation surface) is directed upward. Subsequently, as shown in FIG. 25E, a conductive paste 41 is applied to the island 31 of the lead frame 34 by the dispenser 40. Thereafter, as shown in FIG. 25E, like the prior art, the rear surface of the chip 29 is pushed from below by the pickup needle, with the surface protection tape interposed. Thus, the chip 29 is separated from the surface protection tape. The chip 29 held by the collet 39 is moved onto the island 31 of lead frame 34. Thus, the chip 29 is die-bonded to the island 31.

According to this mounting method, each chip 29 can be easily transferred to a remote manufacturing apparatus, located in another room or another factory, in the state in which the chips 29 are adhered to the surface protection tape 46 of flat ring 47. Thus, the invention can be applied to various manufacturing apparatuses or various manufacturing methods.

Seventh Embodiment

FIGS. 26A to 26E illustrate a method of manufacturing a semiconductor device according to a seventh embodiment of the present invention and are, specifically, perspective views illustrating in succession steps of mounting divided chips on lead frames. Like the first embodiment, the wafer 21 is divided into chips 29 through the steps illustrated in FIGS. 8 to 10. The flat ring 25 and tape 26, on which the divided chips 29 are adhered and fixed, are removed from the chuck table 27 of the lapping apparatus. The chips 29, as shown in FIG. 26A, are picked up. In this case, the chip 29 is pushed up by the pickup, needle, with the surface protection tape 26 interposed. Thus, the chip 29 is separated from the surface protection tape 26 and adsorbed by the collet 38. The collet 38 has a chip inverting mechanism. As is shown in FIG. 26B, the collet 38 is rotated by 180° so that a downward adsorber is directed upward. In this state, the chip 29 is transferred to another collet 39 by using an aerial chip transfer mechanism. Then, the collet 39 is received in a chip tray 48, as shown in FIG. 26C. In the chip tray 48, the major surface of the chip 29 is situated upward. Then, as shown in FIG. 26D, a conductive paste 41 is applied to the island 31 of the lead frame 34 by the dispenser 40. Thereafter, as shown in FIG. 26E, the chip 29 is taken up from the chip tray 48 by the collet 39. The chip 29 held by the collet 39 is moved onto the island 31 of lead frame 34 and die-bonded to the island 31.

According to this mounting method, like the sixth embodiment, each chip 29 can be easily transferred to a remote manufacturing apparatus, located in another room or another factory, in the state in which the chips 29 is received in the chip tray 48. Thus, the invention can be applied to various manufacturing apparatuses or various manufacturing methods.

Eighth Embodiment

Figure 27B:
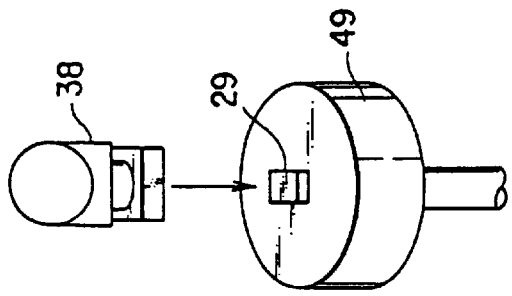
FIGS. 27A to 27D illustrate a method of manufacturing a semiconductor device according to an eighth embodiment of the present invention and are, specifically, perspective views illustrating in succession steps of mounting divided chips on lead frames.
Figure 27A:
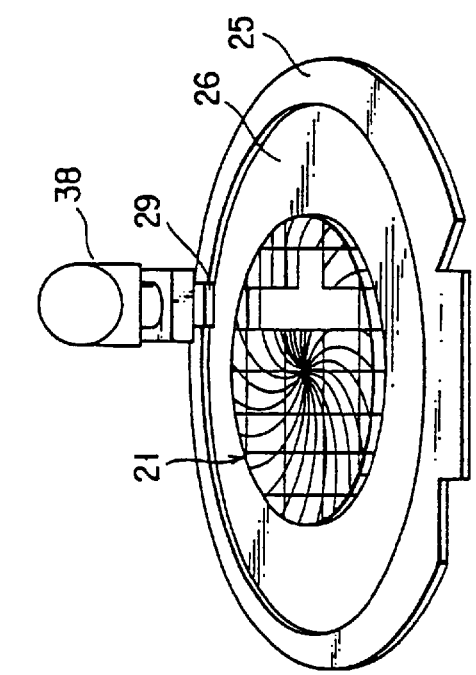
Figure 27D:
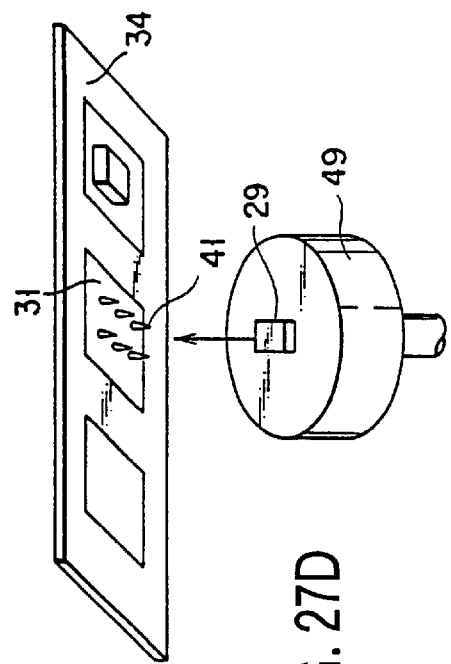
Figure 27C:
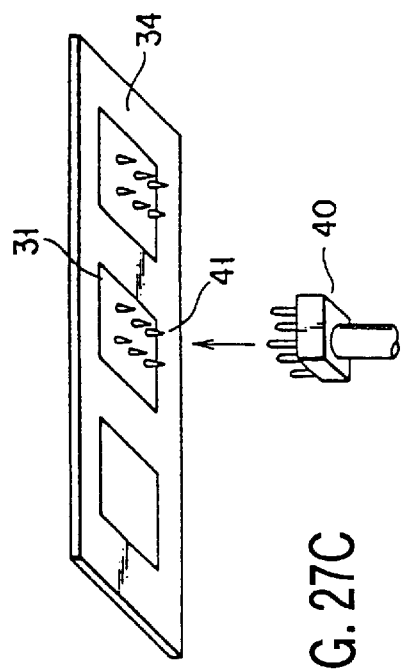

FIGS. 27A to 27D illustrate a method of manufacturing a semiconductor device according to an eighth embodiment of the present invention and are, specifically, perspective views illustrating in succession steps of mounting divided chips on lead frames. Like the first embodiment, the wafer 21 is divided into chips 29 through the steps illustrated in FIGS. 8 to 10. The flat ring 25 and tape 26, on which the divided chips 29 are adhered and fixed, are removed from the chuck table 27 of the lapping apparatus. The chips 29, as shown in FIG. 27A, are picked up. In this case, the chip 29 is pushed up by the pickup needle, with the surface protection tape 26 interposed. Thus, the chip 29 is separated from the surface protection tape 26 and adsorbed by the collet 38. In this state, as shown in FIG. 27B, the chip 29 is mounted on a processing stage 38. Then, as shown in FIG. 27C, a conductive paste 41 is applied to the island 31 of the lead frame 34 by the dispenser 40. In this case, a chip mounting surface of the lead frame 34 is directed downward, and the conductive paste 41 is applied, from below, to the lower surface of lead frame 34 by the dispenser 40. Then, as shown in FIG. 27D, the chip 29 mounted on the processing stage 49 is die-bonded to the lead frame 34.

According to this mounting method, there is no need to reverse the upper and lower sides of the chip 29. Thus, the collet 38 (does not need to have a chip inverting mechanism, and the structure of the apparatus is simplified. In addition, there is no need to transfer the picked-up chip to another surface protection tape, or transfer the chip to the chip tray.

Ninth Embodiment

Figure 28B:
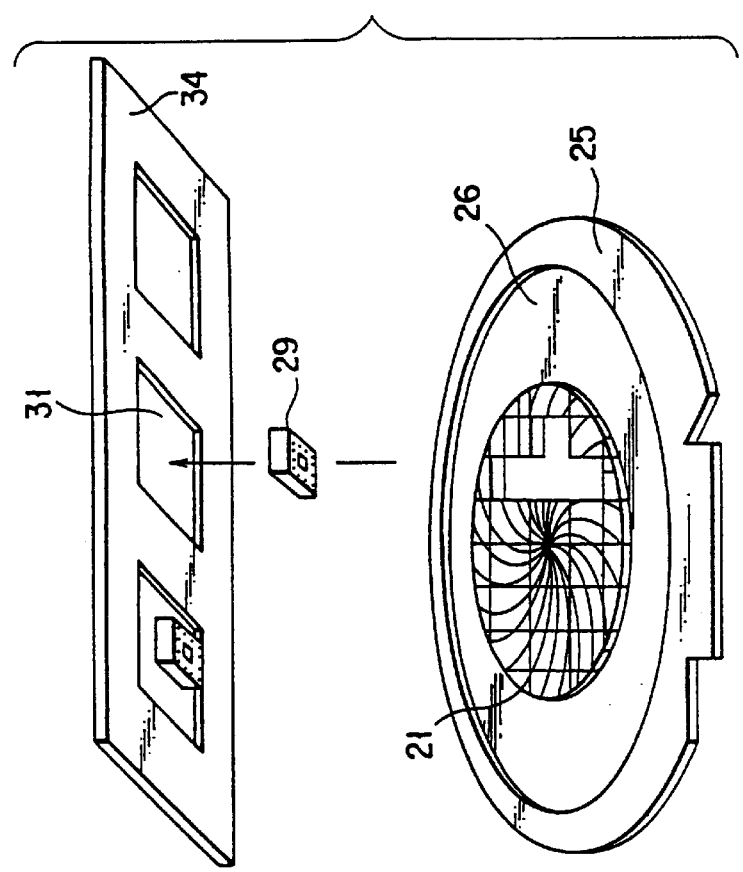
FIGS. 28A and 28B illustrate a method of manufacturing a semiconductor device according to a ninth embodiment of the present invention and are, specifically, perspective views illustrating in succession steps of mounting divided chips on lead frames.
Figure 28A:
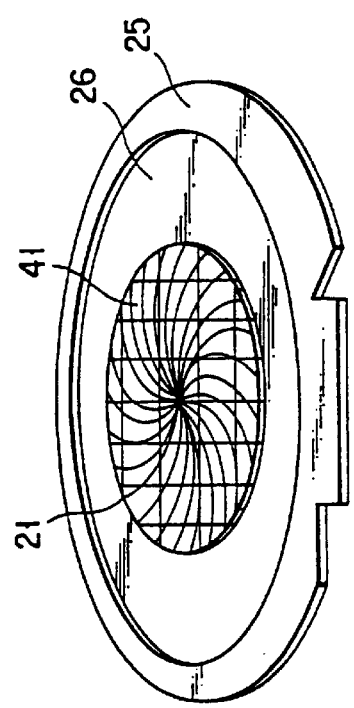

FIGS. 28A and 28B illustrate a method of manufacturing a semiconductor device according to a ninth embodiment of the present invention and are, specifically, perspective views illustrating in succession steps of mounting divided chips on lead frames. Like the first embodiment, the wafer 21 is divided into chips 29 through the steps illustrated in FIGS. 8 to 10. The flat ring 25 and tape 26, on which the divided chips 29 are adhered and fixed, are removed from the chuck table 27 of the lapping apparatus. As shown in FIG. 28A, a conductive paste 41 is coated on the rear surface of each chip 29. Then, as shown in FIG. 28B, a lead frame 34 is situated above the flat ring 25. The chip 29 is pushed up by the pickup needle, with the surface protection tape 26 interposed. Thus, the chip 29 is separated from the surface protection tape 26 and die-bonded to the island 31 of lead frame 34.

Modifications

The present invention is not limited to the first to ninth embodiments, and various modifications may be made without departing from the spirit of the present invention. For example, in the first embodiment, the wafer 21 is fixed on the dicing chuck table 23 at the time of forming grooves. However, as in the prior art, the wafer may be fixed on the dicing chuck table in the state in which a flat ring is attached to an adhesive sheet. Alternatively, grooves may be formed in the state in which the wafer is fixed on a flat plate or the wafer is fixed on an adhesive sheet used as a flat plate.

In the lapping and polishing step illustrated in FIGS. 11 and 18, the surface protection tapes (adhesive sheets) are referred to as a holding member. However, the holding member may be another type. For example, it is possible to use a wax, an adsorption pad, a thermocompression bonding sheet, a substrate coated with adhesive material, a resist coated on a semiconductor element, and combinations thereof.

Although the pattern formation surface 21' of wafer 21 is attached to the adhesive sheet (surface protection tape 26), a very thin film may be interposed between the pattern formation surface 21' of wafer 21 and the adhesive sheet. In the case where the very thin film is interposed, for example, a liquid called Silitecto II may be sprayed on the pattern formation surface of the wafer to form a coating film. Then, an adhesive sheet may be attached. Alternatively, a single-side or double-side adhesive tape may be attached on a flat plate, and a wafer may be fixed thereon.

Furthermore, the pickup needle used to separate the chip from the surface protection tape may not be used. Alternatively, the rear surface of the chip may be sucked by a vacuum and the chip may be separated from the surface protection tape.

As has been described above, the present invention can provide a wafer dividing method and a semiconductor device manufacturing method capable of suppressing breakage of wafers at the time of thinning wafers by lapping or transferring the wafers. In addition, the invention can provide a wafer dividing method and a semiconductor device manufacturing method capable of reducing the number of manufacturing steps and the manufacturing cost. Moreover, the invention can provide a wafer dividing method and a semiconductor device manufacturing method capable of decreasing the degree of chipping on the rear side of wafers and preventing a decrease in breaking strength of chips. Besides, the wear of the dicing blade can be reduced, and the life of the dicing blade can be increased.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A wafer dividing method comprising the steps of:
   forming grooves in a surface of a wafer, on which semiconductor elements are formed, along dicing lines by means of a dicing blade having a curved surface at the tip, the grooves being deeper than a thickness of a finished chip and having a curved bottom surface;
   attaching a holding member on the surface of the wafer on which the semiconductor elements are formed; and
   lapping and polishing a rear surface of the wafer to divide the wafer into chips, and keeping on lapping and polishing the rear surface of the wafer even after the wafer is divided into chips, until the wafer is made to have the thickness of the finished chip, and
   wherein a lapping and polishing amount required to attain the thickness of the finished chip after a lapped face of the wafer reaches the bottom surface of the groove, and a depth of a region of the curved bottom surface define a ratio of not less than 0.3.

2. The wafer dividing method according to claim 1, wherein the depth of the grooves is greater than the thickness of the finished chip by at least 5 $\mu$m.

3. The wafer dividing method according to claim 1, wherein the depth of the grooves is greater than the thickness of the finished chip by 5 to 60 $\mu$m.

4. The wafer dividing method according to claim 1, wherein said holding member is at least one selected from the group consisting of an adhesive tape, a wax, an adsorption pad, a thermocompression bonding sheet, a substrate coated with adhesive material, and a resist coated on the semiconductor elements.

5. The wafer dividing method according to claim 1, wherein said step of lapping and polishing the rear surface of the wafer until the wafer is made to have the thickness of the finished chip includes:
   a first step of lapping and polishing the rear surface of the wafer by means of a grindstone having first-diameter grinding particles such that the thickness of the wafer is greater than the thickness of the finished chip; and
   a second step of further lapping and polishing the rear surface lapped and polished in the first step by means of a grindstone having second-diameter grinding particles smaller than the first-diameter grinding particles until the thickness of the wafer becomes equal to the thickness of the finished chip.

6. The wafer dividing method according to claim 5, wherein major particles of said first-diameter particles are in a range of 40 to 60 $\mu$m, while major particles of said second-diameter particles are in a range of 4 to 6 $\mu$m.

7. A wafer dividing method comprising the steps of:
   forming grooves in a surface of the wafer, on which semiconductor elements are formed, along chip parting lines by etching, a depth of the grooves, as viewed from the surface of the wafer, being greater than a thickness of a finished chip, and each of the grooves having a curved bottom surface;
   attaching a holding member on the surface of the wafer on which the semiconductor elements are formed; and
   lapping and polishing a rear surface of the wafer to divide the wafer into chips, and keeping on lapping and polishing the rear surface of the wafer even after the wafer is divided into chips, until the wafer is made to have the thickness of the finished chip, and
   wherein a lapping and polishing amount required to attain the thickness of the finished chip after a lapped face of the wafer reaches the bottom surface of the groove, and a depth of a region of the curved bottom surface define a ratio of not less than 0.3.

8. The wafer dividing method according to claim 7, wherein the depth of the grooves is greater than the thickness of the finished chip by at least 5 $\mu$m.

9. The wafer dividing method according to claim 7, wherein the depth of the grooves is greater than the thickness of the finished chip by 5 to 60 $\mu$m.

10. The wafer dividing method according to claim 7, wherein said holding member is at least one selected from the group consisting of an adhesive tape, a wax, an adsorption pad, a thermocompression bonding sheet, a substrate coated with adhesive material, and a resist coated on the semiconductor elements.

11. The wafer dividing method according to claim 7, wherein said step of lapping and polishing the rear surface of the wafer until the wafer is made to have the thickness of the finished chip includes:
    a first step of lapping and polishing the rear surface of the wafer by means of a grindstone having first-diameter grinding particles such that the thickness of the wafer is greater than the thickness of the finished chip; and
    a second step of further lapping and polishing the rear surface lapped and polished in the first step by means of a grindstone having second-diameter grinding particles smaller than the first-diameter grinding particles until the thickness of the wafer becomes equal to the thickness of the finished chip.

12. The wafer dividing method according to claim 11, wherein major particles of said first-diameter particles are in a range of 40 to 60 $\mu$m, while major particles of said second-diameter particles are in a range of 4 to 6 $\mu$m.

13. A semiconductor device manufacturing method comprising the steps of:
    forming a semiconductor element on a major surface of a wafer;
    forming grooves in the major surface of the wafer by dicing along dicing lines on the wafer by means of a dicing blade having a curved face at a tip end thereof, such that a depth of the grooves, as viewed from the major surface of the wafer, is greater than a thickness of a finished chip, and such that each of the grooves has a curved bottom surface;
    attaching an adhesive sheet on the major surface of the wafer;
    lapping and polishing a rear surface of the wafer to divide the wafer into chips, and keeping on lapping and polishing the rear surface of the wafer even after the wafer is divided into chips, until the wafer is made to have the thickness of the finished chip; and
    separating each of the divided chips from the adhesive sheet and sealing each chip in a package,
    wherein a lapping and polishing amount required to attain the thickness of the finished chip after a lapped face of the wafer reaches the bottom surface of the groove, and a depth of a region of the curved bottom surface of the groove define a ratio of not less than 0.3.

14. The wafer dividing method according to claim 13, wherein the depth of the grooves is greater than the thickness of the finished chip by at least 5 $\mu$m.

15. The wafer dividing method according to claim 13, wherein the depth of the grooves is greater than the thickness of the finished chip by 5 to 60 $\mu$m.

16. The wafer dividing method according to claim 13, wherein said step of separating each of the separated chips from the adhesive sheet and sealing each of the chips in a package includes the steps of:
- mounting said each chip separated from the adhesive sheet on an island of a lead frame;
- wire-bonding inner lead portions of the lead frame and pads of said chip; and
- sealing said chip, said island and said inner lead portions in the package.

17. The wafer dividing method according to claim 13, wherein said step of separating each of the separated chips from the adhesive sheet and sealing each of the chips in a package includes the steps of:
- bonding one end of a lead on a major surface of the chip separated from the adhesive sheet;
- wire-bonding said lead and each of pads of said chip; and
- sealing said chip and said one end of the lead in the package.

18. The wafer dividing method according to claim 13, wherein said step of lapping and polishing the rear surface of the wafer until the wafer is made to have the thickness of the finished chip includes:
- a first step of lapping and polishing the rear surface of the wafer by means of a grindstone having first-diameter grinding particles such that the thickness of the wafer is greater than the thickness of the finished chip; and
- a second step of further lapping and polishing the rear surface lapped and polished in the first step by means of a grindstone having second-diameter grinding particles smaller than the first-diameter grinding particles until the thickness of the wafer becomes equal to the thickness of the finished chip.

19. The wafer dividing method according to claim 18, wherein major particles of said first-diameter particles are in a range of 40 to 60 $\mu$m, while major particles of said second-diameter particles are in a range of 4 to 6 $\mu$m.

20. A wafer dividing method comprising the steps of:
- forming semiconductor elements on a major surface of a wafer;
- forming grooves in a surface of the wafer, on which the semiconductor elements are formed, along chip parting lines by etching, a depth of the grooves, as viewed from the major surface of the wafer, being greater than a thickness of a finished chip, and each of the grooves having a curved bottom surface;
- attaching an adhesive sheet on the major surface of the wafer;
- lapping and polishing a rear surface of the wafer to divide the wafer into chips, and keeping on lapping and polishing the rear surface of the wafer even after the wafer is divided into chips, until the wafer is made to have the thickness of the finished chip; and
- separating each of the divided chips from the adhesive sheet and sealing each chip in a package, wherein a lapping and polishing amount required to attain the thickness of the finished chip after a lapped face of the wafer reaches the bottom surface of the groove, and a depth of a region of the curved bottom surface define a ratio of not less than 0.3.

21. The wafer dividing method according to claim 20, wherein the depth of the grooves is greater than the thickness of the finished chip by at least 5 $\mu$m.

22. The wafer dividing method according to claim 20, wherein the depth of the grooves is greater than the thickness of the finished chip by 5 to 60 $\mu$m.

23. The wafer dividing method according to claim 20, wherein said step of separating each of the separated chips from the adhesive sheet and sealing each of the chips in a package includes the steps of:
- mounting said each chip separated from the adhesive sheet on an island of a lead frame;
- wire-bonding inner lead portions of the lead frame and pads of said chip; and
- sealing said chip, said island and said inner lead portions in the package.

24. The wafer dividing method according to claim 20, wherein said step of separating each of the separated chips from the adhesive sheet and sealing each of the chips in a package includes the steps of:
- bonding one end of a lead on a major surface of the chip separated from the adhesive sheet;
- wire-bonding said lead and each of pads of said chip; and
- sealing said chip and said one end of the lead in the package.

25. The wafer dividing method according to claim 20, wherein said step of lapping and polishing the rear surface of the wafer until the wafer is made to have the thickness of the finished chip includes:
- a first step of lapping and polishing the rear surface of the wafer by means of a grindstone having first-diameter grinding particles such that the thickness of the wafer is greater than the thickness of the finished chip; and
- a second step of further lapping and polishing the rear surface lapped and polished in the first step by means of a grindstone having second-diameter grinding particles smaller than the first-diameter grinding particles until the thickness of the wafer becomes equal to the thickness of the finished chip.

26. The wafer dividing method according to claim 25, wherein major particles of said first-diameter particles are in a range of 40 to 60 $\mu$m, while major particles of said second-diameter particles are in a range of 4 to 6 $\mu$m.

* * * * *